United States Patent
Ohnishi et al.

(10) Patent No.: US 9,204,567 B2
(45) Date of Patent: Dec. 1, 2015

(54) MUSIC REPRODUCTION APPARATUS

(75) Inventors: Masanori Ohnishi, Osaka (JP);
Masahiko Nakamura, Osaka (JP);
Hiroyuki Kusu, Osaka (JP); Yasue Chihara, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 269 days.

(21) Appl. No.: 13/819,896

(22) PCT Filed: Dec. 9, 2011

(86) PCT No.: PCT/JP2011/006895
§ 371 (c)(1),
(2), (4) Date: Feb. 28, 2013

(87) PCT Pub. No.: WO2013/084271
PCT Pub. Date: Jun. 13, 2013

(65) Prior Publication Data
US 2013/0314857 A1    Nov. 28, 2013

(51) Int. Cl.
| | |
|---|---|
| *H05K 7/00* | (2006.01) |
| *G11B 31/00* | (2006.01) |
| *G11B 33/02* | (2006.01) |
| *G11B 33/06* | (2006.01) |

(Continued)

(52) U.S. Cl.
CPC .............. *H05K 7/00* (2013.01); *G11B 17/0405* (2013.01); *G11B 25/10* (2013.01); *G11B 31/00* (2013.01); *G11B 33/02* (2013.01); *G11B 33/027* (2013.01); *G11B 33/06* (2013.01); *G11B 33/122* (2013.01)

(58) Field of Classification Search
CPC ... G11B 25/10; G11B 33/06; H04R 2205/021
See application file for complete search history.

(56) References Cited

U.S. PATENT DOCUMENTS 7,869,195 B1 * 1/2011 Patton ............... G06F 1/1616
361/679.01
2004/0162029 A1   8/2004 Grady (Continued)

FOREIGN PATENT DOCUMENTS

JP      62-178671 U     11/1987
JP      07-307089 A     11/1995

(Continued)

OTHER PUBLICATIONS

International Search Report for corresponding International Application No. PCT/JP2011/006895 mailed Jan. 17, 2012 (English translation provided; previously submitted on Feb. 28, 2013 with application).

(Continued)

*Primary Examiner* — Adrian S Wilson
*Assistant Examiner* — Izak Baranowski
(74) *Attorney, Agent, or Firm* — Renner, Otto, Boisselle & Sklar, LLP

(57) ABSTRACT

A music reproduction apparatus in which a first reproduction unit that has a first retainer capable of retaining a first external audio source and a second reproduction unit that has a second retainer capable of retaining a second external audio source are arranged next to each other. The music reproduction apparatus includes an opening-closing door that covers the first reproduction unit and the second reproduction unit in an openable and closable manner. The second retainer is positioned at an accommodation position on the deeper side than the opening-closing door in the state covered by the opening-closing door. When the opening-closing door is moved to uncover the second retainer, the second retainer is drawn from the accommodation position to move to a draw out position.

14 Claims, 31 Drawing Sheets

(51) Int. Cl.
  *G11B 25/10* (2006.01)
  *G11B 33/12* (2006.01)
  *G11B 17/04* (2006.01)

(56) References Cited

U.S. PATENT DOCUMENTS

| | | | |
|---|---|---|---|
| 2006/0280045 A1 | 12/2006 | Ritsher et al. | |
| 2010/0192811 A1* | 8/2010 | Khalil | G06F 1/1632 108/28 |
| 2011/0157801 A1* | 6/2011 | Satterfield | G06F 1/1607 361/679.01 |

FOREIGN PATENT DOCUMENTS

| | | |
|---|---|---|
| JP | 08-096893 A | 4/1996 |
| JP | 11-126470 A | 5/1999 |
| JP | 2007-523433 A | 8/2007 |
| JP | 2008-546126 A | 12/2008 |

OTHER PUBLICATIONS

Form PCT/ISA/237 for corresponding International Application No. PCT/JP2011/006895 mailed Jan. 17, 2012 (English translation provided; previously submitted on Feb. 28, 2013 with application).
International Search Report for corresponding International Application No. PCT/JP2011/006895 mailed Jan. 17, 2012.
Form PCT/ISA/237 for corresponding International Application No. PCT/JP2011/006895 mailed Jan. 17, 2012.
Japanese Office Action dated Nov. 25, 2014 for corresponding Japanese Application No. 2013-505654.

\* cited by examiner

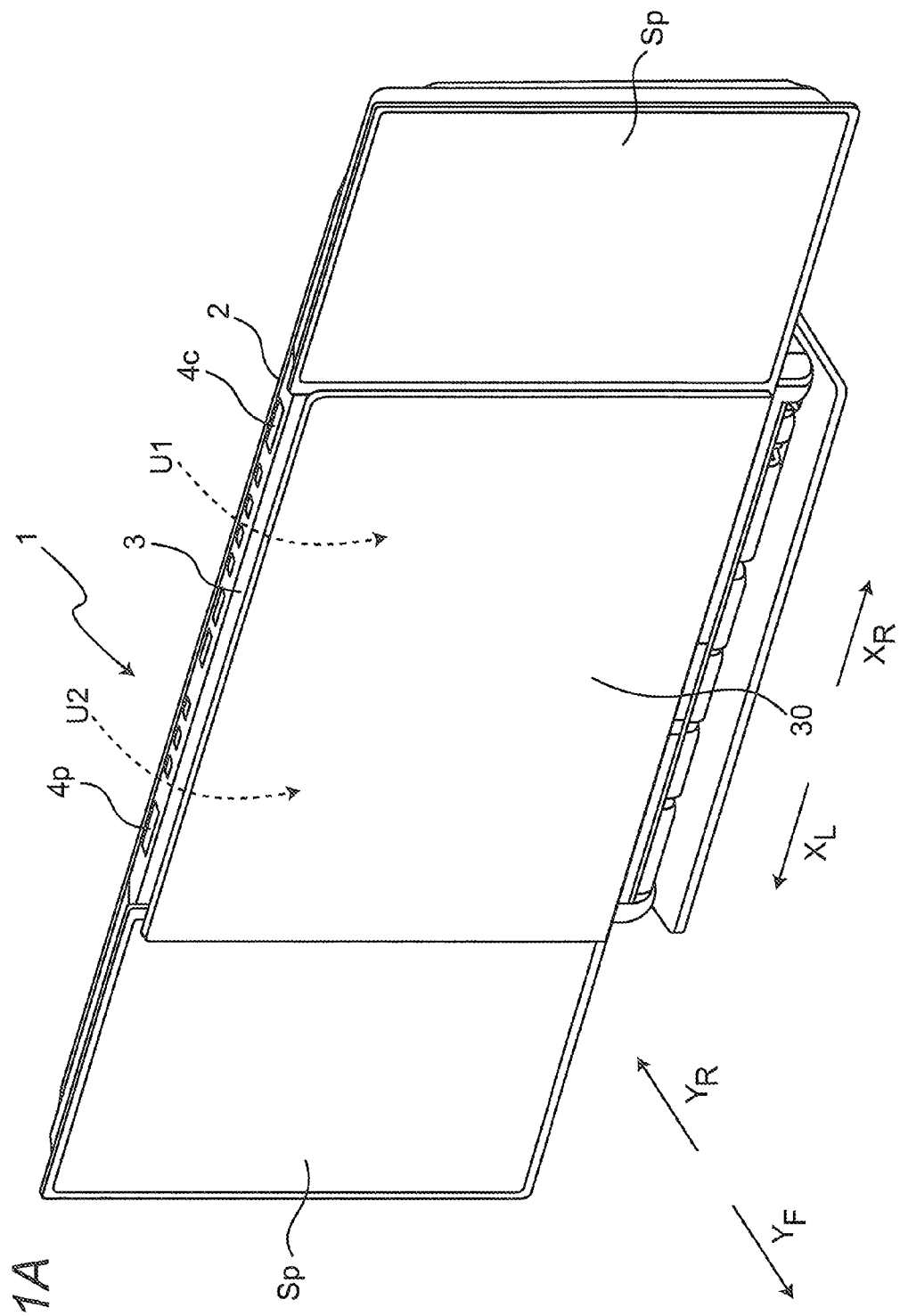

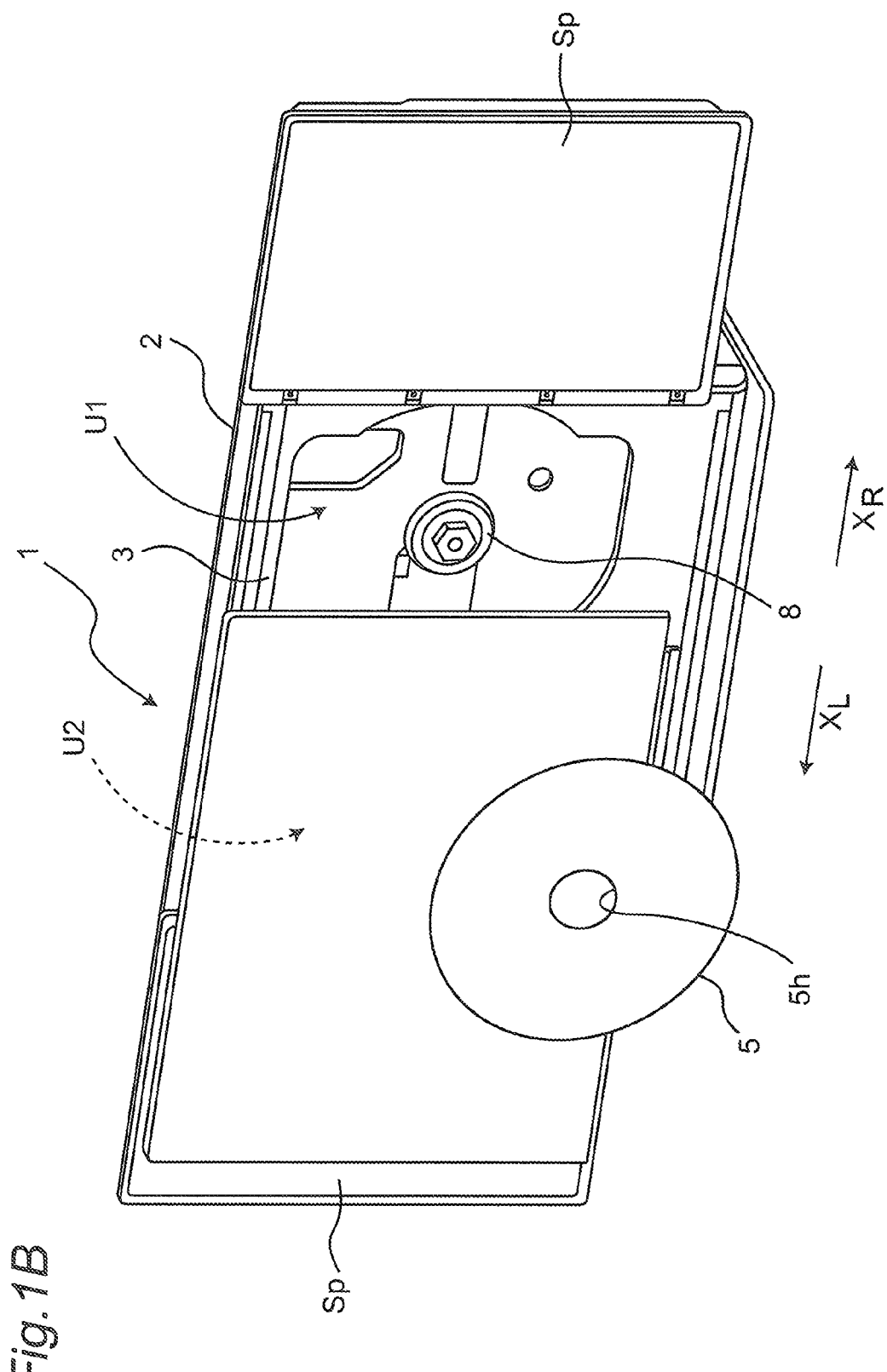

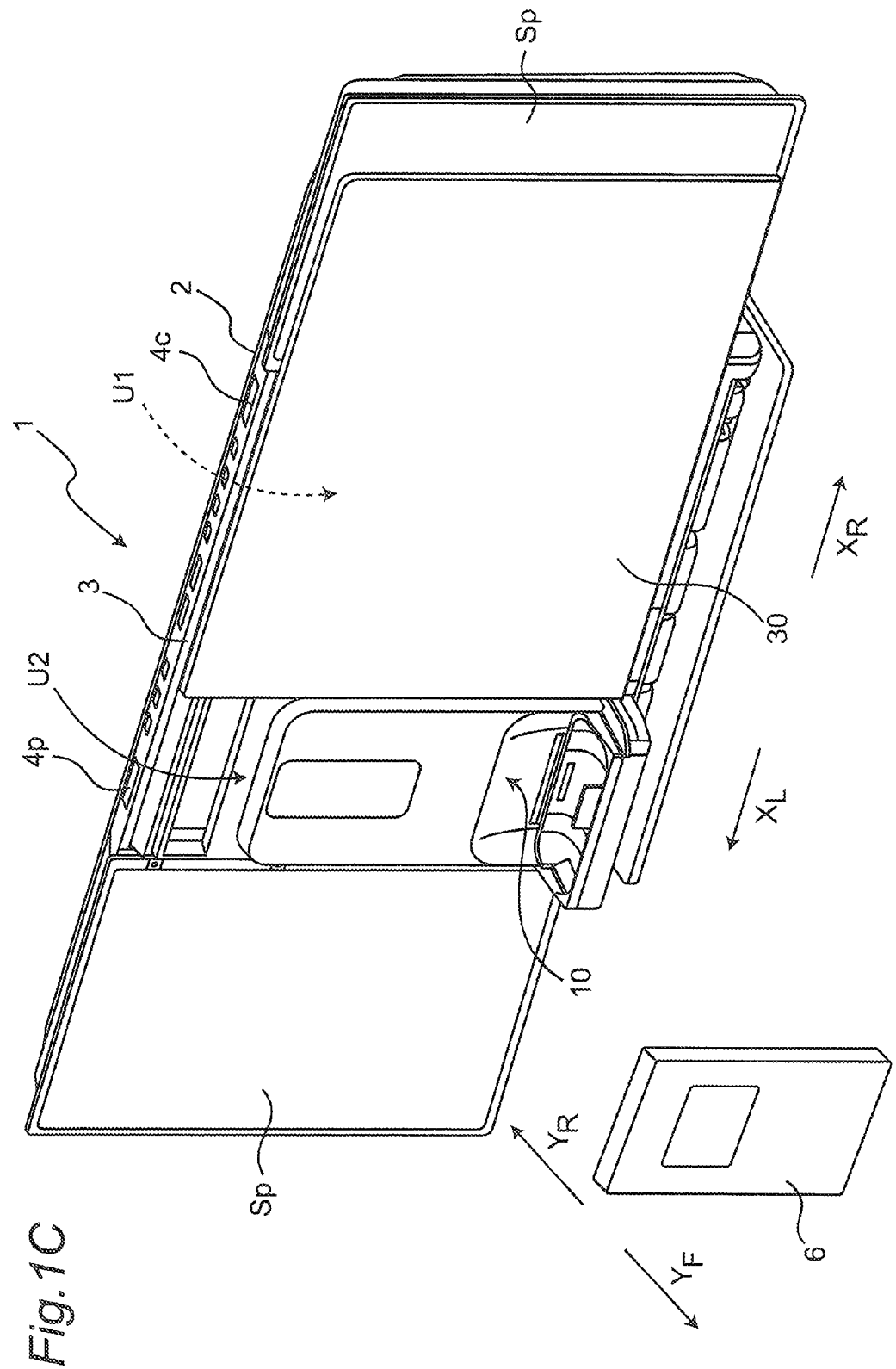

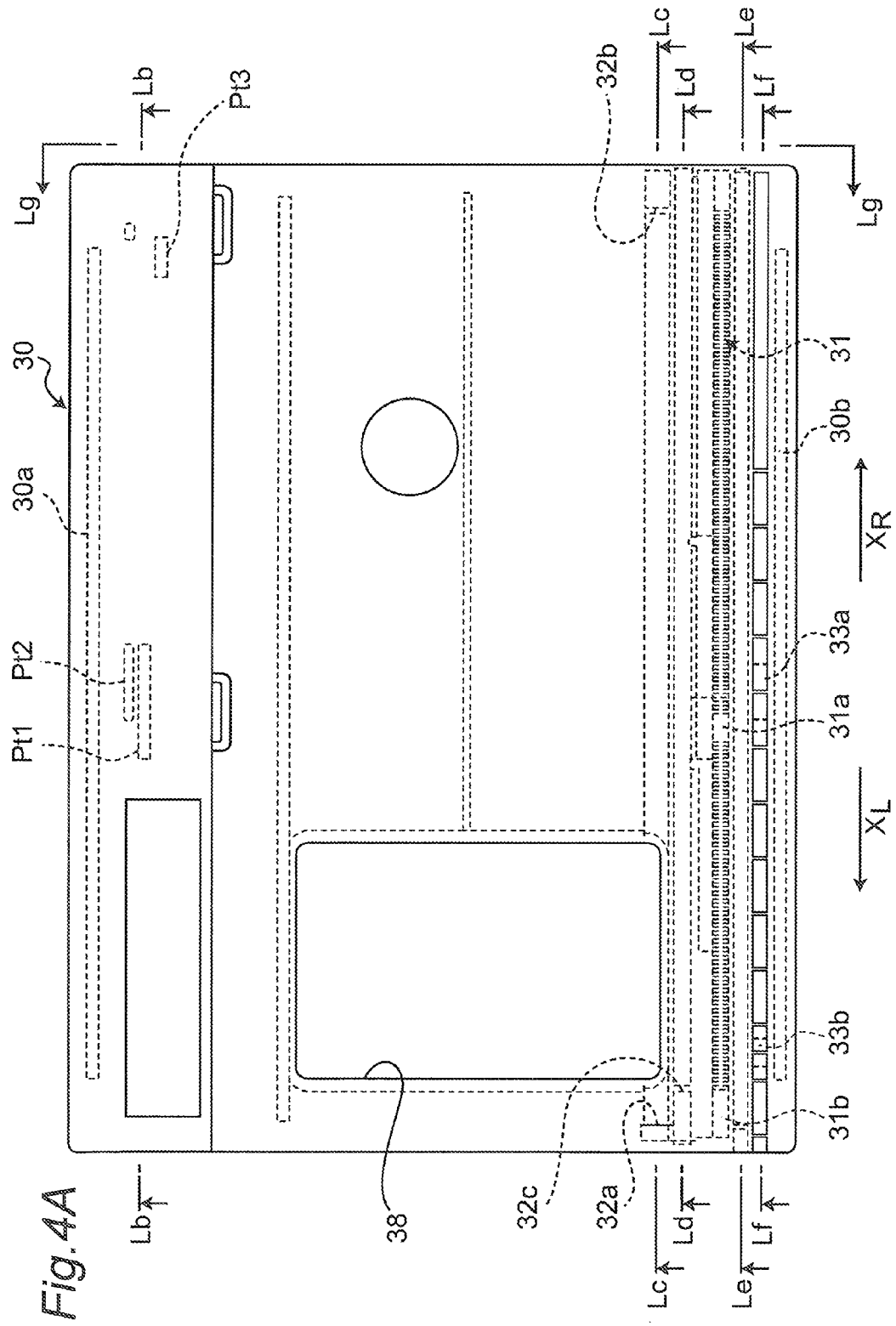

Fig.6A
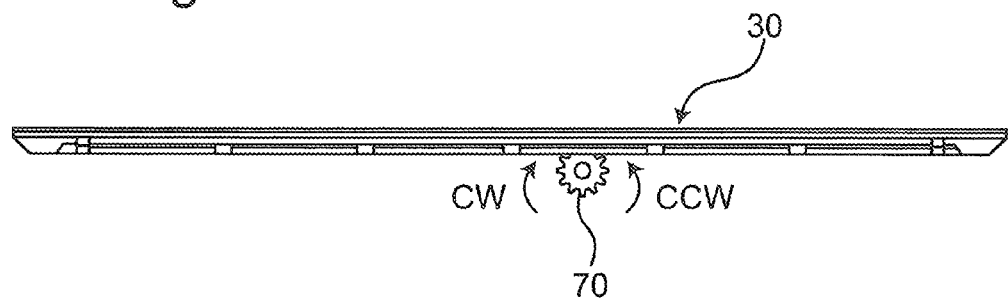
(a)
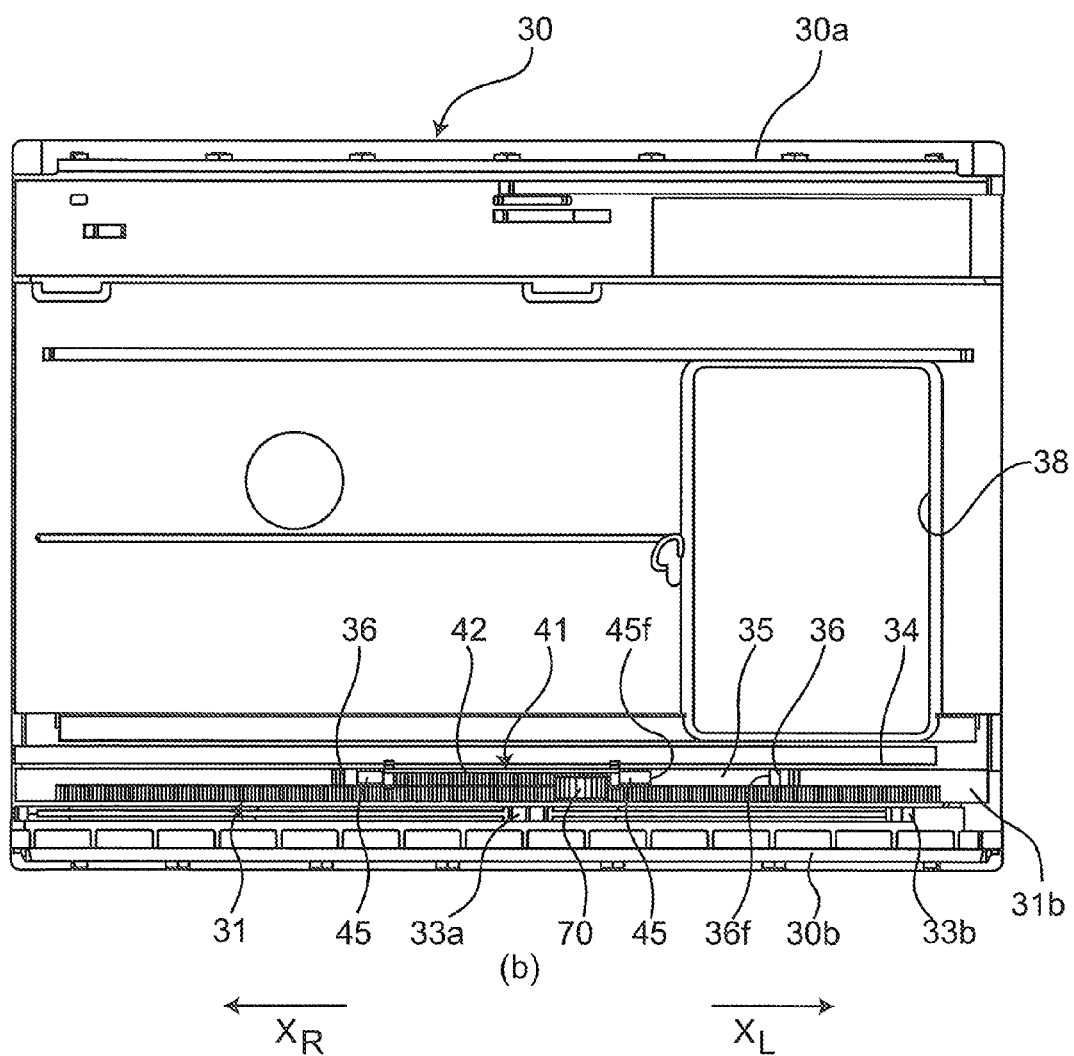
(b)

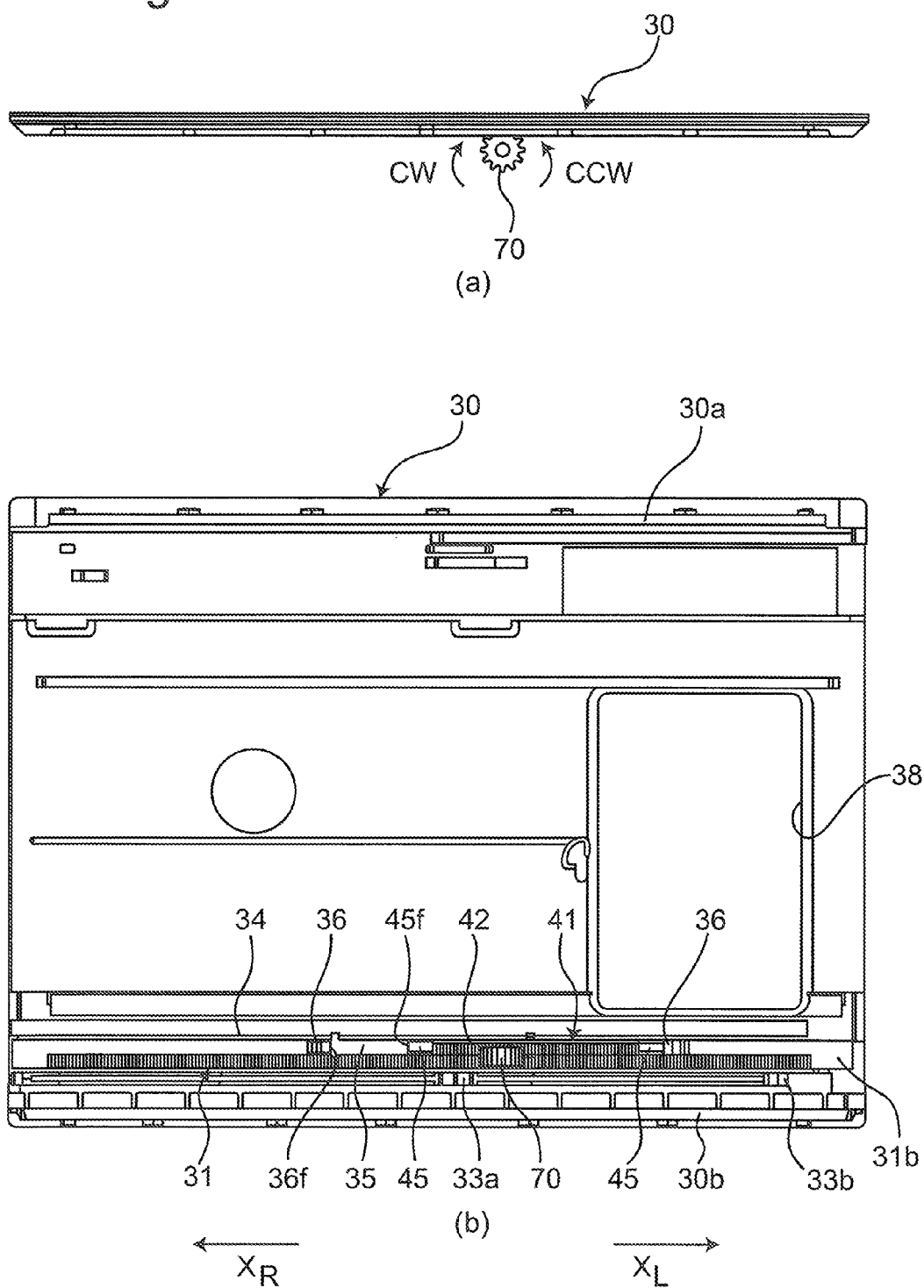

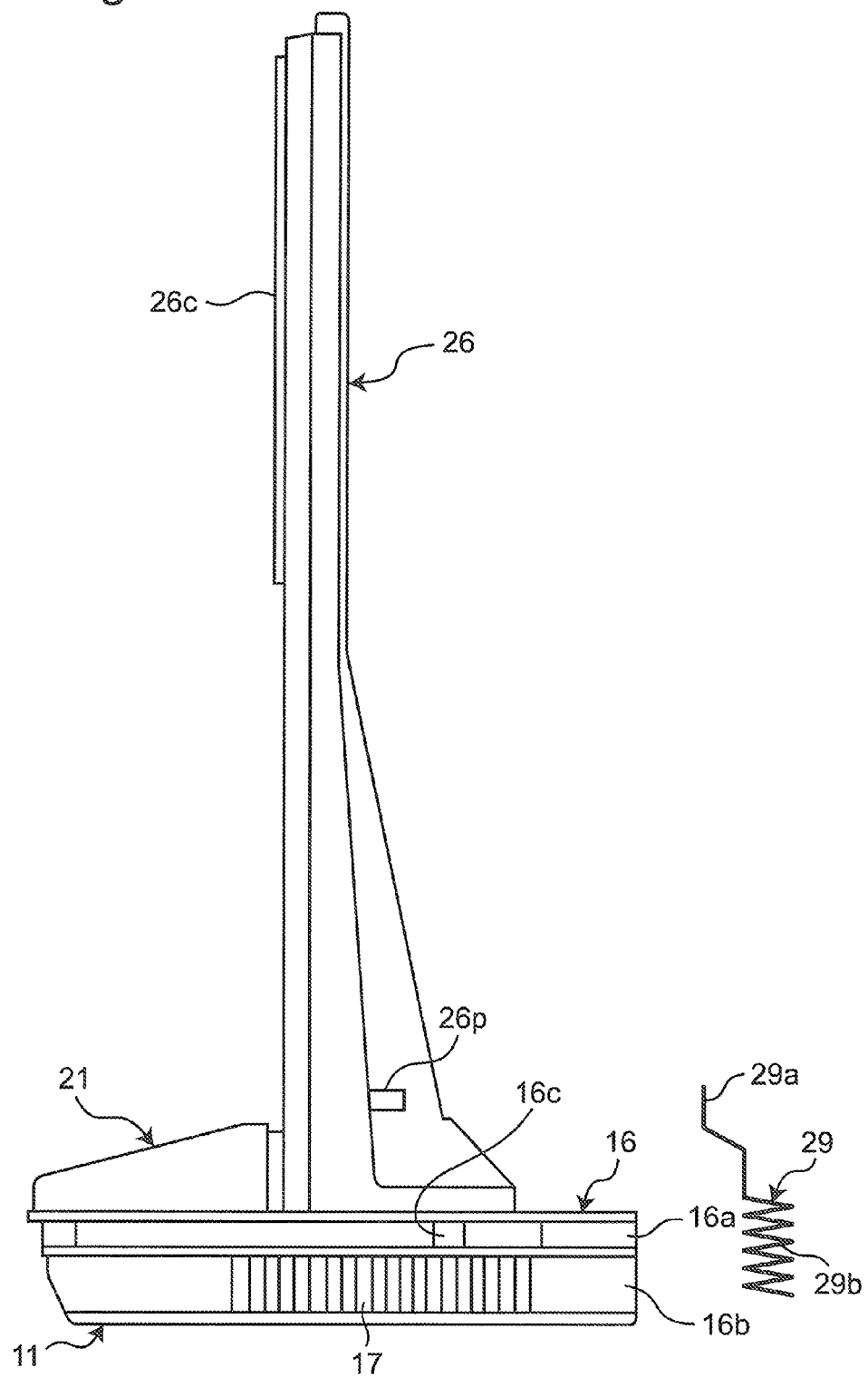

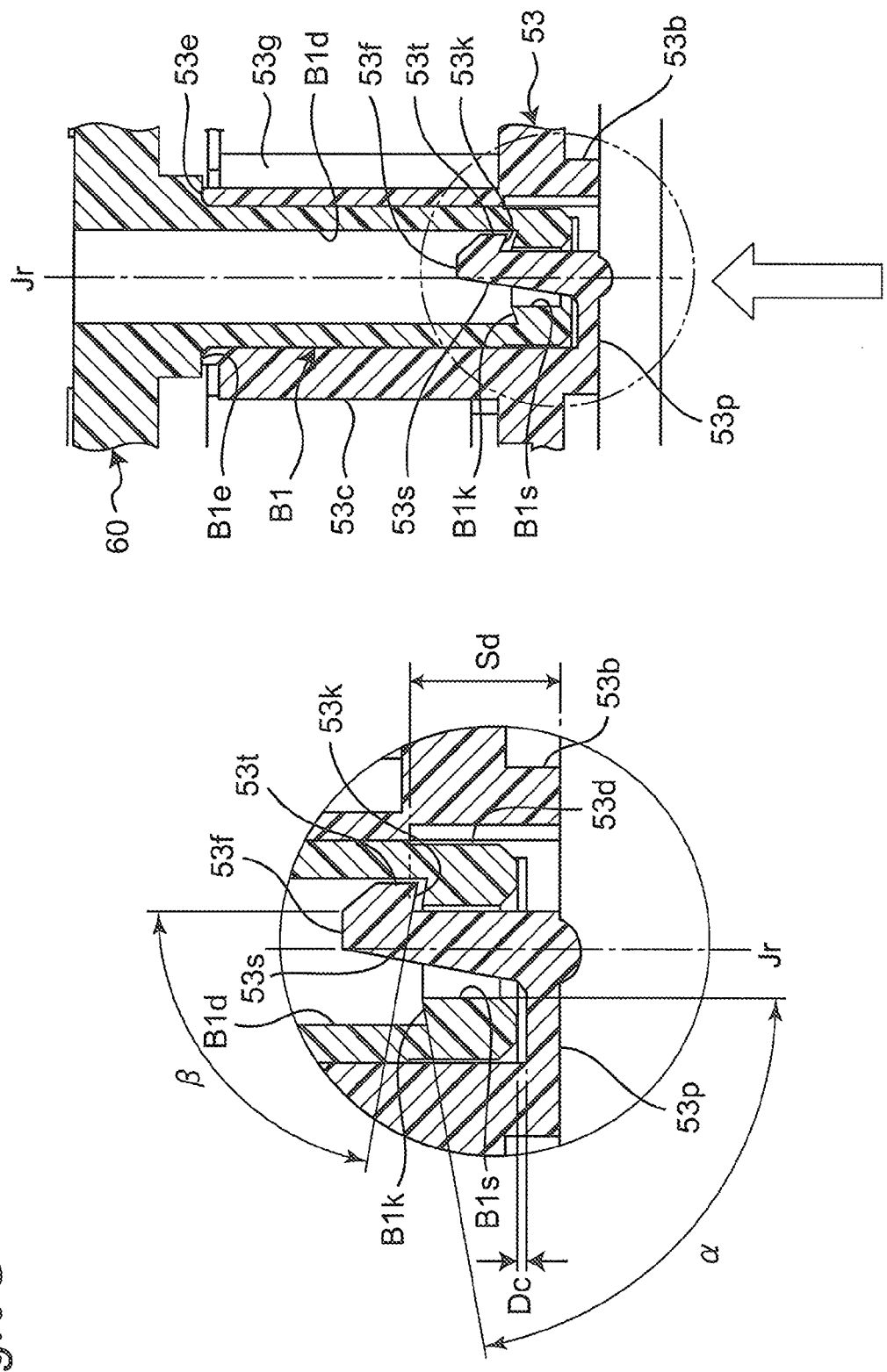

Fig.9H
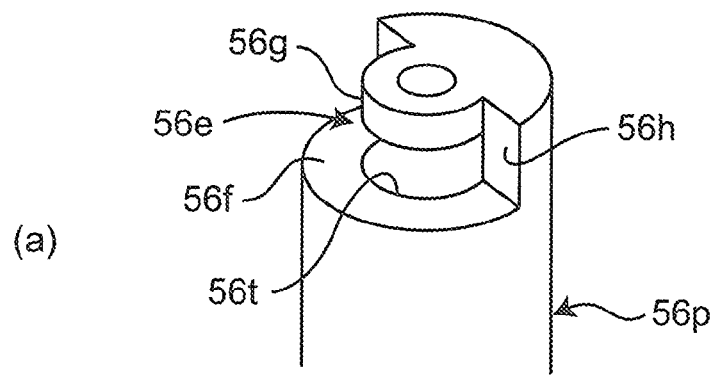
(a)
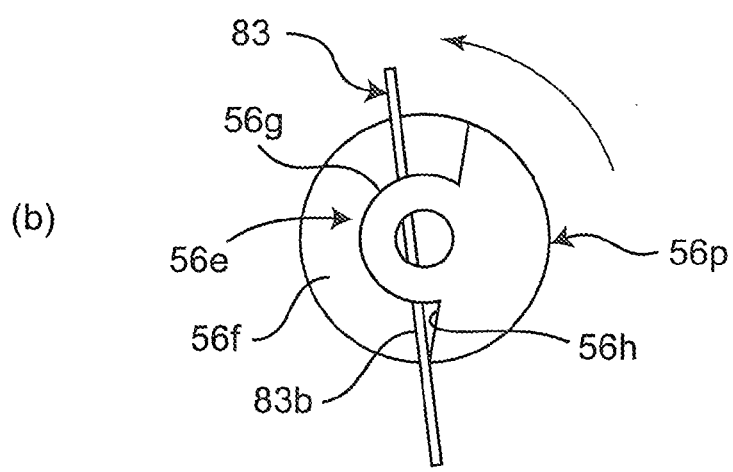
(b)
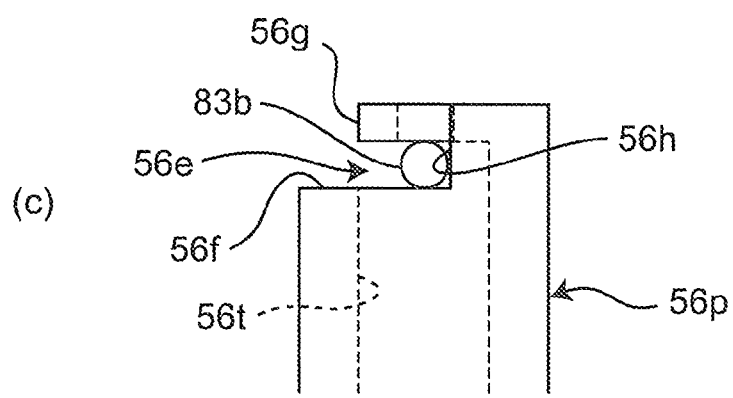
(c)

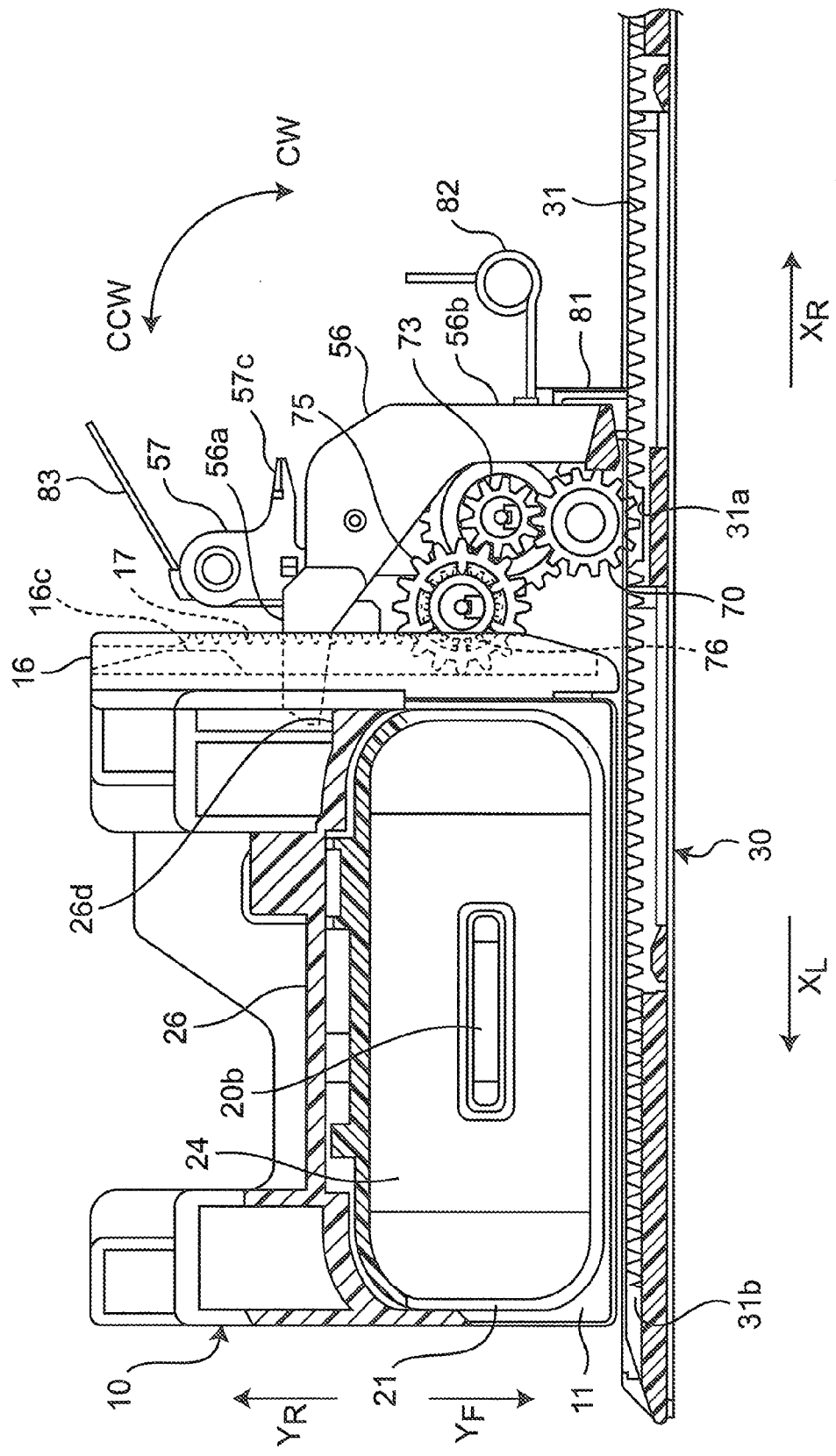

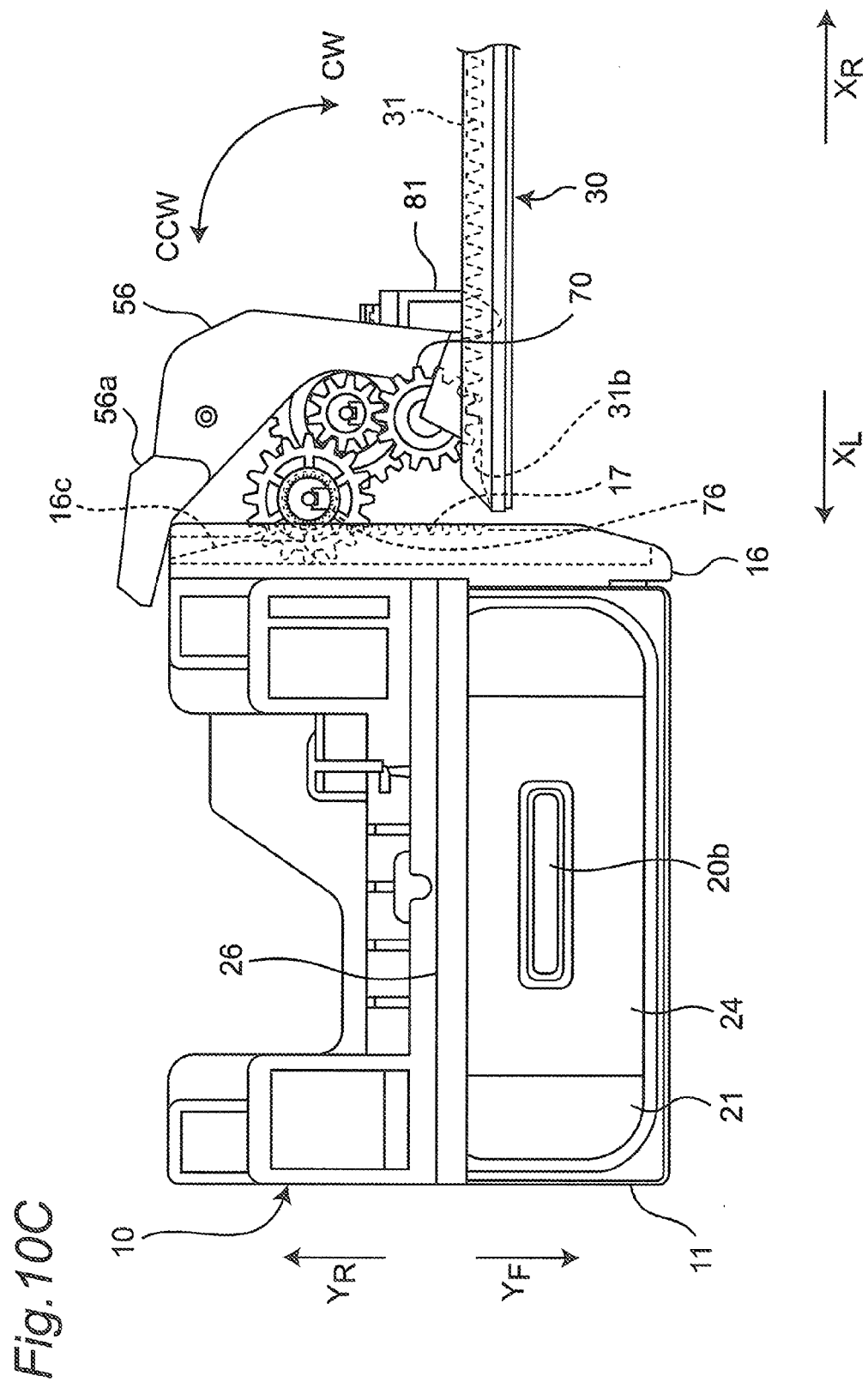

MUSIC REPRODUCTION APPARATUS

TECHNICAL FIELD

The present invention relates to a music reproduction apparatus, and particularly, to a music reproduction apparatus capable of addressing reproduction of two different types of external audio sources.

BACKGROUND ART

Conventionally, there are commonly well-known music reproduction apparatuses, which employ portable media players (hereinafter appropriately abbreviated as the PMPs) as removable external audio sources, and which are capable of downloading and reproducing desired music (for example, see Patent Literature 1). It is to be noted that, in the present specification, the "portable media players" are not limited to those dedicated to downloading music, but include devices with the mobile phone function which are capable of connecting to a communication line of the Internet or the like, and are capable of downloading music via the communication line. Further, in the present specification, the "external audio sources" refer to audio sources or music media such as the aforementioned portable media players or compact discs, which can be attached to and removed from the music reproduction apparatuses.

Further, there are other known music reproduction apparatuses, which employ two types of audio sources, i.e., the portable media player and the compact disc (hereinafter appropriately abbreviated as the CD), each as the removable external audio sources, so that one of the audio sources can be selectively used for music reproduction. Such apparatuses are partially already in use.

Still further, in connection with such music reproduction apparatuses capable of addressing reproduction of two different types of external audio sources, there is known one in which a CD-use reproduction unit having a CD retaining mechanism capable of retaining a CD and a PMP-use reproduction unit having a PMP retaining mechanism capable of retaining a PMP are arranged next to each other, and an opening-closing door that covers at least one of the reproduction units in an openable and closable manner is provided.

PATENT LITERATURES

[Patent Literature 1]: JP 2008-546126 W

DISCLOSURE OF THE INVENTION

Problems to be Solved by the Invention

As described above, in connection with the music reproduction apparatus in which the CD-use reproduction unit and the PMP-use reproduction unit are arranged next to each other, and the opening-closing door that covers at least one of the reproduction units in an openable and closable manner is provided, the PMP retaining mechanism has a pedestal on which the PMP is placed and retained. In the state where the opening-closing door closes the front side thereof, the PMP retaining mechanism is accommodated in the accommodating portion in the deep position of the apparatus. Accordingly, when the PMP is to be attached or removed by opening the opening-closing door, it is necessary to draw the PMP retaining mechanism from the accommodating portion. Therefore, a selection lever that selectively switches the position of the PMP retaining mechanism between the accommodation position and the draw out position is provided. A user is required to take trouble to manipulate the selection lever when attaching or removing the PMP so as to switch the positions of the PMP retaining mechanism. It is troublesome and disadvantageous for the user.

Further, the PMP retaining mechanism for attaching and retaining the PMP commonly includes a terminal block that has an attaching face portion that receives the PMP attached from a predetermined direction (for example, from above), and a connector terminal that is provided at the attaching face portion of the terminal block to which a terminal socket portion of the PMP is connected. When the PMP is attached, the terminal socket portion of the PMP is fitted such that it is connected to the connector terminal of the terminal block. However, the connection portion commonly cannot be visually recognized in most cases and, therefore, there is a technical problem of poor workability.

Accordingly, an object of the present invention is, in connection with a music reproduction apparatus capable of addressing reproduction of two different types of external audio sources, to make it possible to allow a retainer of an external audio source at an accommodation position on the deeper side than an opening-closing door in the state where the external audio source is covered by the opening-closing door to automatically move between the accommodation position and a draw out position in accordance with the opening-closing state of the opening-closing door without the necessity of performing troublesome manual operation for the user.

Further, another object of the present invention is to improve workability in connecting the terminal socket portion of the PMP to the connector terminal of the PMP retaining mechanism.

Means for Solving the Problems

Therefore, A First Aspect Of the present invention is a music reproduction apparatus including: a first external audio source-use first reproduction unit that has a first retainer capable of retaining a first external audio source; a second external audio source-use second reproduction unit that has a second retainer capable of retaining a second external audio source, the first reproduction unit and the second reproduction unit being arranged in parallel; and an opening-closing door that covers at least one of the first reproduction unit and the second reproduction unit in an openable and closable manner. The at least one of the retainers that is covered by the opening-closing door in an openable and closable manner is located at an accommodation position on a deeper side than the opening-closing door in a state where the at least one of the retainers is covered by the opening-closing door, and the at least one of the retainers is drawn out from the accommodation position and moves to a draw out position when the opening-closing door is moved to uncover the retainer.

With this structure, the retainer of the external audio source that is located at the accommodation position on the deeper side than the opening-closing door in the state covered by the opening-closing door is automatically moved between the accommodation position and the draw out position in accordance with the opening-closing state of the opening-closing door.

In this case, a moving direction of the opening-closing door and a moving direction of the retainer may be substantially perpendicular to each other. The music reproduction apparatus may further include a switching means for selectively and substantially continuously switching and transmitting a drive force from a single drive source between a first power transmission path that moves the opening-closing door and a second power transmission path that moves the retainer.

With this structure, even in the case where the moving direction of the opening-closing door and that of the retainer are substantially perpendicular to each other, the moving of the opening-closing door and that of the retainer can be carried out with the single drive source without any trouble.

In this case, it is possible that, specifically: a) a first and a second driving gears each constantly rotated via a prescribed deceleration mechanism by a rotary drive force from the single drive source are provided; b) the opening-closing door includes an opening-closing door rack gear that extends in the moving direction of the opening-closing door and that is capable of meshing with the first driving gear, and an opening-closing door engaging portion that is capable of engaging with one end side of a switching lever of the switching means, the opening-closing door being capable of moving among a fully closed position where the reproduction units are entirely covered, a first open position where the second retainer solely is covered while the first retainer being uncovered, and a second open position where the first retainer solely is covered while the second retainer being uncovered; c) the second retainer includes a retainer rack gear that extends in the moving direction of the second retainer and that is capable of meshing with the second driving gear, and a retainer engaging portion that is capable of engaging with an other end side of the switching lever of the switching means, the second retainer being capable of moving between the accommodation position and the draw out position; d) when the opening-closing door moves from the fully closed position to the second open position, the opening-closing door engaging portion pushes the one end side of the switching lever, to cause the other end side of the switching lever to push the retainer engaging portion to move the second retainer from the accommodation position toward the draw out position, such that the second driving gear meshes with the retainer rack gear to bring the second retainer to the draw out position; and e) when the second retainer moves from the draw out position to the accommodation position, the retainer engaging portion pushes the other end side of the switching lever, to cause the one end side of the switching lever to push the opening-closing door engaging portion to move the opening-closing door from the second open position toward the fully closed position, such that the first driving gear meshes with the opening-closing door rack gear to bring the opening-closing door to the fully closed position.

With this structure, specifically, by using the first and the second driving gears, the opening-closing door rack gear and the retainer rack gear, the switching lever and the like, even in the case where the moving direction of the opening-closing door and that of the retainer are substantially perpendicular to each other, moving of the opening-closing door and that of the retainer can be carried out with the single drive source without any trouble.

In this case, the apparatus may further include a positioning member that positions the opening-closing door at one of the fully closed position and the second open position. The opening-closing door may be provided on a back side thereof with cam grooves each having a slope face portion capable of engaging with the positioning member when the opening-closing door is at the fully closed position and at the second open position, respectively. The opening-closing door rack gear may be provided with notches so that the opening-closing door and the first driving gear become out of mesh in a state where the opening-closing door is at the fully closed position and at the second open position, respectively. When the opening-closing door moves to one of the fully closed position and the second open position to cause the opening-closing door rack gear and the first driving gear to become out of mesh, the positioning member may engage with the corresponding one of the cam grooves while pushing the slope face portion of the corresponding cam groove in a direction in which a terminal teeth near corresponding one of the notches of the opening-closing door rack gear and the first driving gear become away from each other.

With this structure, when the opening-closing door moves to one of the fully closed position and the second open position to cause the opening-closing door rack gear and the first driving gear to become out of mesh, the positioning member engages with the cam groove while pushing the slope face portion of the cam groove in a direction in which a terminal teeth near the notch of the opening-closing door rack gear and the first driving gear become away from each other. This can more surely cause the opening-closing door rack gear and the first driving gear become out of mesh.

In these cases, the apparatus may further include a second positioning member that positions the second retainer at one of the accommodation position and the draw out position. The second retainer may be provided at a side portion thereof with a cam-shaped portion having a slope face portion being capable of engaging with the second positioning member. The retainer rack gear may be provided with a notch so that the retainer rack gear and the second driving gear become out of mesh in a state where the second retainer is at the accommodation position. When the second retainer moves to the accommodation position to cause the retainer rack gear and the second driving gear to become out of mesh, the second positioning member may engage with the cam-shaped portion while pushing the slope face portion of the cam-shaped portion in a direction in which a terminal teeth near the notch of the retainer rack gear and the second driving gear become away from each other.

With this structure, when the second retainer moves to the accommodation position and the retainer rack gear and the second driving gear become out of mesh, the second positioning member engages with the cam-shaped portion while pushing the slope face portion of the cam-shaped portion in the direction in which a terminal teeth near the notch of the retainer rack gear and the second driving gear become away from each other. This can more surely cause the retainer rack gear and the second driving gear to become out of mesh.

In the cases described above, preferably, the opening-closing door rack gear is provided with the notch so that the opening-closing door rack gear and the first driving gear become out of mesh in a state where the opening-closing door is at the second open position. The second retainer is provided, at a side end portion on a side of drawing out and near to the opening-closing door, with a slope face portion that tilts by a prescribed angle. When the second retainer moves from the accommodation position to the draw out position in a state where the opening-closing door has moved to the second open position to cause the opening-closing door rack gear and the first driving gear to become out of mesh, the slope face portion of the second retainer pushes a side end portion of the opening-closing door on a side near to the second retainer, to move the opening-closing door in a direction in which the opening-closing door rack gear and the first driving gear become out of mesh. When the second retainer is at the draw out position, even when the opening-closing door is pushed toward the second retainer, the side end portion of the opening-closing door and the side end portion of the second retainer abut on each other, to prevent the opening-closing door from moving toward the second retainer side.

With this structure, when the second retainer moves from the accommodation position to the draw out position in the state where the opening-closing door has moved to the second open position to cause the opening-closing door rack gear and the first driving gear to become out of mesh, the slope face portion of the second retainer pushes the side end portion of the opening-closing door on the side near to the second retainer, to move the opening-closing door in the direction in which the opening-closing door rack gear and the first driving gear become out of mesh. This allows the second retainer to move from the accommodation position to the draw out position without any trouble. Further, when the second retainer is at the draw out position, even when the opening-closing door is pushed toward the second retainer, the side end portion of the opening-closing door and the side end portion of the second retainer abut on each other, to prevent the opening-closing door from moving toward the second retainer side. This surely prevents the opening-closing door rack gear and the first driving gear from meshing with each other.

Further, in the cases described above, preferably, the retainer rack gear is provided with the notch so that the retainer rack gear and the second driving gear become out of mesh in the state where the second retainer is at the accommodation position. The opening-closing door is provided, at a side end portion on a side back of the opening-closing door and near to the second retainer, with a slope face portion that tilts by a prescribed angle. When the opening-closing door moves from the second open position to the fully closed position in a state where the second retainer has moved to the accommodation position to cause the retainer rack gear and the second driving gear to become out of mesh, the slope face portion on the back side of the opening-closing door pushes an end portion of the second retainer on a draw out side, to move in a direction in which the retainer rack gear and the second driving gear become out of mesh. When the opening-closing door is at the fully closed position, even when the second retainer is pushed toward the draw out side, the end portion of the second retainer on the draw out side abuts on the back side of the opening-closing door. This prevents the second retainer from moving toward the draw out side.

With this structure, when the opening-closing door moves from the second open position to the fully closed position in the state where the second retainer has moved to the accommodation position to cause the retainer rack gear and the second driving gear to become out of mesh, the slope face portion on the back side of the opening-closing door pushes the end portion of the second retainer on the draw out side, to move in a direction in which the retainer rack gear and the second driving gear become out of mesh. This allows the opening-closing door to move from the second open position to the fully closed position without any trouble. Further, when the opening-closing door is at the fully closed position, even when the second retainer is pushed toward the draw out side, the end portion of the second retainer on the draw out side abuts on the back side of the opening-closing door, to prevent the second retainer from moving toward the draw out side. Therefore, the retainer rack gear and the second driving gear are surely prevented from meshing with each other.

Further, in the cases described above, preferably, the apparatus further includes a second position detection switch that detects the second retainer located at the draw out position, and a second positioning member that positions the second retainer at one of the accommodation position and the draw out position. The second position detection switch actuates in association with an operation of the second positioning member.

With this structure, the second position detection switch actuates in association with the operation of the second positioning member. This makes it possible to detect the second retainer located at the draw out position.

Further, in the cases described above, the second retainer includes a base pedestal that is movably arranged between the accommodation position and the draw out position, a back supporter that is fixed to the base pedestal to support a back face of the second external audio source, a terminal block that is supported by the base pedestal so as to be capable of swinging in front and rear directions, and a connector terminal for connecting the second external audio source, the connector terminal being attached to the terminal block. Between at least one of the base pedestal and the back supporter and the terminal block, a biasing means for exerting a biasing force that presses the second external audio source connected to the connector terminal against the back supporter is provided.

With this structure, the action of the biasing means presses the second external audio source connected to the connector terminal of the terminal block against the back supporter fixed to the base pedestal, whereby the second external audio source can be more stably retained.

Another aspect of the present invention is a music reproduction apparatus capable of using a portable media player as a removable external audio source, including: a) a terminal block that has an attaching face portion that receives the portable media player being attached from a prescribed direction; b) a connector terminal mounted at the attaching face portion of the terminal block where a terminal socket portion of the portable media player being connected, and c) a mirror surface member arranged at the attaching face portion of the terminal block, the mirror surface member reflecting at least the terminal socket portion of the portable media player when the terminal socket portion is to be connected to the connector terminal.

With this structure, since the mirror surface member is arranged at the attaching face portion of the terminal block, when the terminal socket portion of the PMP is to be connected to the connector terminal of the PMP retaining mechanism, the mirror surface member reflects at least the terminal socket portion of the PMP.

Effects of the Invention

According to the present invention, in connection with the music reproduction apparatus capable of addressing reproduction of two different types of external audio sources, it is possible to allow the retainer of the external audio source at the accommodation position on the deeper side than the opening-closing door in the state where the external audio source is covered by the opening-closing door to automatically move between the accommodation position and the draw out position in accordance with the opening-closing state of the opening-closing door without the necessity of performing troublesome manual operation for the user. Thus, the operability of the apparatus can be improved. Further, it becomes possible to surely prevent the occurrence of the interference between the opening-closing door and the retainer of the external audio source when the opening-closing door is opened or closed.

According to another aspect of the present invention, in connection with the music reproduction apparatus capable of using a portable media player as a removable external audio source, provision of the mirror surface member at the attaching face portion of the terminal block allows the mirror surface member to reflect the terminal socket portion of the PMP when the terminal socket portion of the PMP is to be connected to the connector terminal of the terminal block of the PMP retaining mechanism. This allows the user who performs attachment work of the PMP to visually recognize the portion where the PMP and the PMP retaining mechanism are to be connected to each other, whereby the workability can be remarkably improved.

BRIEF DESCRIPTION OF THE DRAWINGS

FIG. 1A is a perspective view being one of the drawings schematically showing the overall structure of a music reproduction apparatus according to an embodiment of the present invention, showing a fully closed state in which reproduction units are both covered by a door;

FIG. 1B is a perspective view being one of the drawings schematically showing the overall structure of the music reproduction apparatus, showing a first open state in which a CD-use reproduction unit is uncovered;

FIG. 1C is a perspective view being one of the drawings schematically showing the overall structure of the music reproduction apparatus, showing a second open state in which a PMP-use reproduction unit is uncovered;

FIG. 4A is a schematic front view of the slide door;

FIG. 6A shows the positional relationship between a driving rack gear and the idle rack, in which (a) is a plan view of the slide door and (b) is a rear view of the slide door;

FIG. 6B shows the positional relationship between the driving rack gear and the idle rack, in which (a) is a plan view of the slide door and (b) is a rear view of the slide door;

FIG. 7C is a side view schematically showing the structure of the PMP retaining mechanism;

FIG. 9G is an enlarged cross-sectional view schematically showing the chief portion of the assembly structure of the driven pulley into the boss portion;

FIG. 9H is an explanatory illustration showing the schematic structure of the bottom end portion of a rotary strut of a switching lever in an enlarged manner;

FIG. 10A is a plan view schematically showing the positional relationship and the moving operation among the PMP retaining mechanism, the driver unit, and the slide door, in a state where the front side of the PMP retaining mechanism is closed by the slide door;

FIG. 10C is a plan view showing the positional relationship and the moving operation among the PMP retaining mechanism, the driver unit, and the slide door, in a state where the PMP retaining mechanism advances to the draw out position;

PREFERRED EMBODIMENTS OF THE INVENTION

Figure 2:
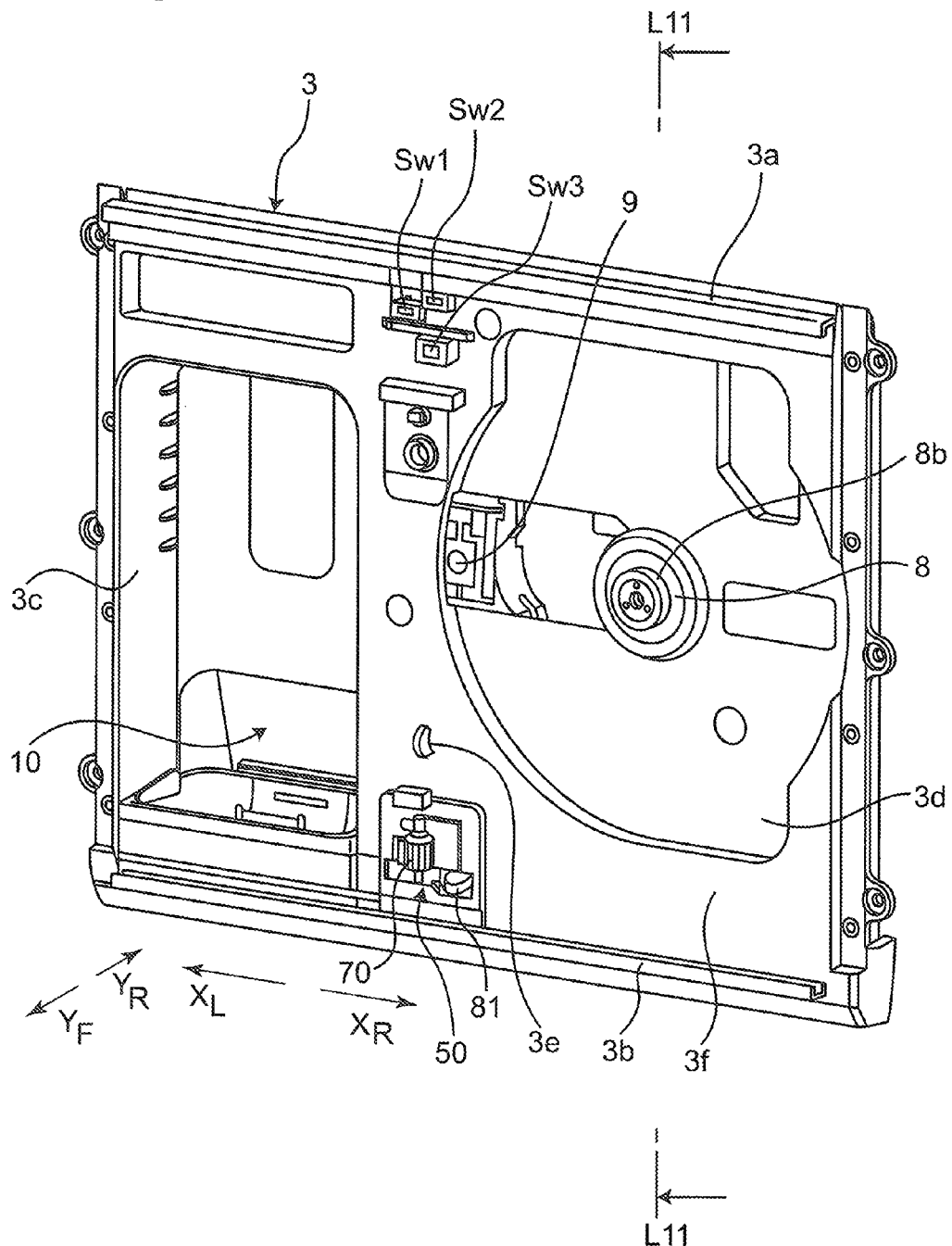
FIG. 2 is a schematic perspective view as seen from the front of a front panel in a state where the slide door of the music reproduction apparatus is removed.

Hereinafter, with reference to the drawings, a detailed description will be given of a music reproduction apparatus according to an embodiment of the present invention. It is to be noted that, in the following description, though the terms referring to particular directions (for example, "top", "bottom", "left", "right", "front", "back", "the clockwise direction", "the counterclockwise direction", and other terms including them) are used, use of the terms is for the purpose of facilitating understanding of the invention with reference to the drawings, and the present invention should not be interpreted as being limited by particular meaning of such terms. Further, in connection with the music reproduction apparatus described in the following, identical or similar constituents are denoted by identical reference symbols.

The music reproduction apparatus according to the present embodiment includes, as will become apparent from the following description, a reproduction unit that performs music reproduction employing, e.g., a compact disc (hereinafter appropriately abbreviated as the "CD"), as an external audio source, and a reproduction unit that performs music reproduction employing, e.g., a portable media player (hereinafter appropriately abbreviated as the "PMP"), as an external audio source. These reproduction units are arranged next to each other in front view. With the music reproduction apparatus, which reproduction unit is to be used can be selectively switched to perform reproduction.

FIGS. 1A to 1C are each a perspective view schematically showing the overall structure of the music reproduction apparatus according to the present embodiment. FIG. 1A shows the fully closed state where both the reproduction units are covered by a door. FIG. 1B shows the first open state where the CD-use reproduction unit is uncovered. FIG. 1C shows the second open state where the PMP-use reproduction unit is uncovered.

With reference to these drawings, a more detailed description will be given. The music reproduction apparatus 1 (hereinafter appropriately abbreviated as "apparatus") includes a CD reproduction unit U1 that performs music reproduction employing a CD 5 as an external audio source and a PMP reproduction unit U2 that performs music reproduction employing a PMP 6 as an external audio source. The reproduction units U1 and U2 are arranged next to each other in the left-right direction in front view, for example.

Further, on both the right and left side of the reproduction units U1 and U2, a pair of speaker apparatuses Sp is aligned. The reproduction units U1 and U2 and the pair of speaker apparatuses Sp and Sp are accommodated in an outer case 2 in the state as being aligned in the left-right direction on the front side of the outer case 2 of the apparatus 1. On the front side of the central region of the outer case 2, a front panel 3 is attached. The reproduction unit U1 and the PMP reproduction unit U2 are installed in the outer case 2 using the front panel 3 as a mounting base.

The CD reproduction unit U1 has a turn table 8 (see FIG. 1B) as a retaining mechanism that can rotatably retain the CD 5. On the other hand, the PMP reproduction unit U2 has a PMP retaining mechanism 10 (see FIG. 1C) on which the PMP 6 can be placed and retained.

It is to be noted that, since the structure for the CD reproduction unit U1 to perform music reproduction using the CD 5 as an external audio source, and the structure for the PMP reproduction unit U2 to perform music reproduction using the PMP 6 as an external audio source are both similar to the conventionally known structures, the detailed description thereof will not be given.

On the front side of the front panel 3, an opening-closing door (slide door) 30 that is slidable in the left direction (the arrow $X_L$ direction) and the right direction (the arrow $X_R$ direction) in the drawings is arranged. The slide door 30 covers the front side of at least one of the CD reproduction unit U1 and the PMP reproduction unit U2 in an openable and closable manner.

More specifically, defining the fully closed position (see FIG. 1A) that covers the front side of both the reproduction units U1 and U2 (the arrow $Y_F$ direction) as the initial position, when the slide door 30 moves from the initial position by a predetermined amount in the left direction (the arrow $X_L$ direction) in the drawings, the slide door 30 arrives at the first open position (see FIG. 1B) that only opens the front side of the CD reproduction unit U1 while the front side of the PMP reproduction unit U2 remaining closed. When the slide door 30 is at the first open position (i.e., in the first open state), the user can freely attach or remove the CD 5 to or from the turn table 8 of the CD reproduction unit U1.

On the other hand, when the slide door 30 moves by a predetermined amount from the initial position in the right direction (the arrow $X_R$ direction) in the drawings, the slide door 30 arrives at the second open position (see FIG. 1C) that only opens the front side of the PMP reproduction unit U2 while the front side of the CD reproduction unit U1 remaining closed. In this manner, when the slide door 30 is at the second open position (i.e., in the second open state), the user can freely attach or remove the PMP 6 to or from the PMP retaining mechanism 10 of the PMP reproduction unit U2.

On the top face of the central region of the outer case 2, operation buttons 4c and 4p for manually operating the slide door 30 are provided. The operation button 4c on the CD reproduction unit U1 side is used in the case where the slide door 30 is operated so as to open or close the front side of the CD reproduction unit U1. That is, the operation button 4c is used when the slide door 30 is moved from the fully closed position (see FIG. 1A) to the first open position (see FIG. 1B), or in the reverse direction. On the other hand, the operation button 4p on the PMP reproduction unit U2 side is used in the case where the slide door 30 is operated so as to open or close the front side of the PMP reproduction unit U2. That is, the manipulation button 4p is used when the slide door 30 is moved from the fully closed position (see FIG. 1A) to the second open position (see FIG. 1C), or in the reverse direction.

Such manipulation of the slide door 30 can also be performed using a remote controller. Further, it is also possible to arrange a contactless sensor near each of the operation buttons 4c and 4p, for example, such that the user can hold his/her hand over the sensor and move the hand in the right or left direction, to thereby move the slide door 30 in the direction.

In the present embodiment, as will be described in detail later, in the state where the front side of the PMP reproduction unit U2 is covered by the slide door 30, the PMP retaining mechanism 10 is located in the accommodation position on the deeper side than the slide door 30, that is, on the rear side (the arrow $Y_R$ direction), and when the slide door 30 is moved and whereby the front side of the PMP retaining mechanism 10 is uncovered, the PMP retaining mechanism 10 is drawn from the accommodation position toward the front side (the arrow $Y_F$ direction) in association with the moving operation of the slide door 30, and moves to the draw out position (see FIG. 1C).

Figure 3:
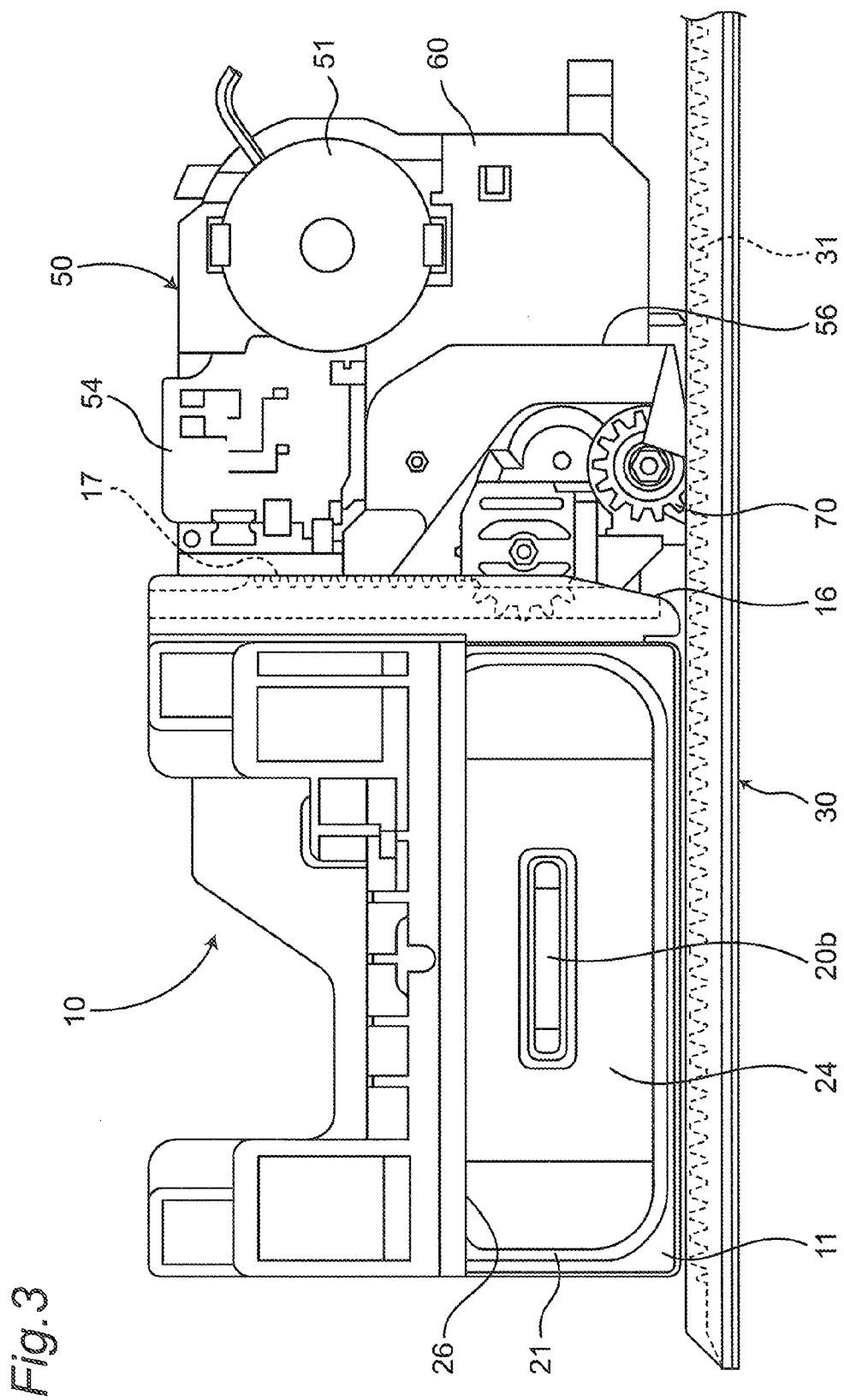
FIG. 3 is a plan view schematically showing the positional relationship of the slide door, a PMP retaining mechanism, a driver unit and the like of the music reproduction apparatus.

FIG. 2 is a perspective view as seen from the front side of the front panel 3 in the state where the slide door 30 is removed. Further, FIG. 3 is a plan view schematically showing the positional relationship of the slide door 30, the PMP retaining mechanism 10, a driver unit 50 and the like.

As shown in the drawings, on the front side near the top edge and the bottom edge of the front panel 3, a pair of top and bottom parallel guide rails 3a and 3b is provided so as to extend in the left-right direction (the arrows $X_L$ and X direction) in the drawings along the top edge and the bottom edge for guiding the sliding operation of the slide door 30. The PMP reproduction unit U2 and the CD reproduction unit U1 are arranged as being aligned on the left and right sides between the top and bottom guide rails 3a and 3b.

In the region of the front panel 3 corresponding to the CD reproduction unit U1, a step-down face 3d as being recessed by a slight amount from a surface 3f of the front panel 3 is formed, and the turn table 8 is attached using this step-down face 3d as the base face. Further, by a side of the turn table 8, a conventionally-known optical pickup 9 is arranged slidably at least in the radial direction of the turn table 8.

On the other hand, in the region of the front panel 3 corresponding to the PMP reproduction unit U2, a recess portion 3c formed to be substantially rectangular in front view and to be recessed from the surface 3f of the front panel 3 by a predetermined depth is provided. The PMP retaining mechanism 10 is accommodated in the recess portion 3c so as to be movable by a predetermined amount in the front and rear directions (in the directions of arrows $Y_F$ and $Y_R$). The mechanism and operation of the PMP retaining mechanism 10 moving in the front and rear directions will be detailed later.

Further, as will be detailed later, between the region of the front panel 3 corresponding to the CD reproduction unit U1 and the region corresponding to the PMP reproduction unit U2, e.g., at the portion substantially central at the bottom portion of the front panel 3, the driver unit 50 which has, e.g., an electric motor 51 (see FIG. 3) as the drive source is positioned.

Further, for example near the driver unit 50, as will be described later, a coming off prevention-purpose protrusion 3e for preventing the slide door 30 from coming off during the slide door 30 is in the sliding operation mode is arranged.

Still further, for example at a relatively top portion of the front panel 3, position detection switches Sw1, Sw2, and Sw3 for the slide door 30 are arranged. As will be detailed later, the switches Sw1 to Sw3 are structured to engage with the protrusions formed on the back side of the slide door 30, to thereby be pressed down to turn on.

By an ON/OFF state of the door position detection switches Sw1, Sw2, and Sw3 being sensed, it becomes possible to recognize at which position the slide door 30 is, i.e., at the fully closed position covering the front side of both the reproduction units U1 and U2 (see FIG. 1A), the first open position opening solely the front side of the CD reproduction unit U1 while still covering the front side of the PMP reproduction unit U2 (see FIG. 1B), or the second open position opening solely the front side of the PMP reproduction unit U2 while still covering the front side of the CD reproduction unit U1 (see FIG. 1C).

Figure 4B:
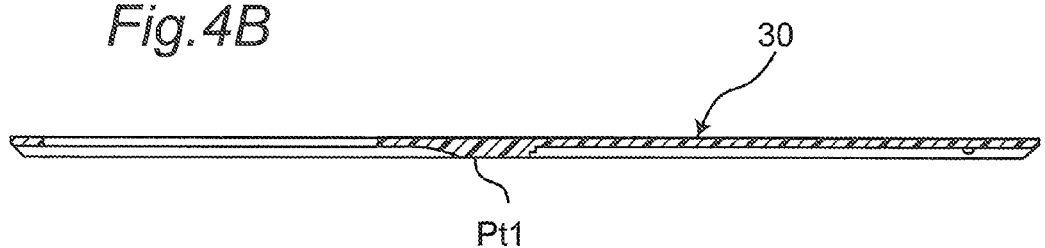
FIG. 4B is a schematic cross-sectional view of the slide door taken along a line Lb-Lb in FIG. 4A.

Next, a description will be given about the structure of the slide door 30. FIG. 4A is a schematic front view of the slide door 30. FIGS. 4B to 4F are schematic cross-sectional views of the slide door taken along lines Lb-Lb to Lf-Lf in FIG. 4A, respectively. Further, FIG. 4G is a view on arrow as seen from the arrow Lg-arrow Lg direction in FIG. 4A.

As shown in FIG. 4A, in the left side region of the slide door 30 in the drawing, an opening window 38 in the size and shape corresponding to the indication display of the PMP 6 is formed. This window 38 is positioned such that it is at the position corresponding to the indication display of the PMP 6 when the slide door 30 is at the fully closed position (see FIG. 1A). Accordingly, use of a transparent or translucent decoration plate 39 (see FIG. 4G) that covers and decorates the front side of the slide door 30 makes it possible for the user to visually recognize from outside the indication display of the PMP 6 even when the slide door 30 is at the fully closed position.

On the back side of near the top edge and the bottom edge of the slide door 30, engaging grooves 30a and 30b extending in the left-right direction (the arrows $X_L$, $X_R$ direction) are formed so as to engage with the guide rails 3a and 3b at the top and bottom of the front panel 3 provided on the front side of the central region of the outer case 2. The shape of the engaging grooves 30a and 30b can be clearly seen from FIG. 4G, for example.

Further, for example at the relatively top portion on the back side of the slide door 30, position detection-purpose protrusions Pt1, Pt2, and Pt3 are formed at the top-bottom direction position so as to respectively correspond to the position detection switches Sw1, Sw2, and Sw3 which are arranged, for example, at the relatively top portion of the front panel 3 (see FIGS. 4A and 4B). When the slide door 30 performs a sliding operation in the left-right directions, the position detection-purpose protrusions Pt1, Pt2, and Pt3 also move. Then, at least one of the protrusions Pt1, Pt2, and Pt3 engages with at least one of the switches Sw1, Sw2, and Sw3, to press down to turn ON the engaged switch.

By the switch Sw1 being turned ON, it is detected that the slide door 30 is at the fully closed position (see FIG. 1A). Further, by the switch Sw3 being turned ON, it is detected that the slide door 30 is at the first open position (see FIG. 1B). Further, when the switch Sw2 is turned ON, emission of the CD reading-purpose laser light is stopped immediately after the slide door 30 starts moving in the first open position direction, for the purpose of securing safety.

Thus, the front panel 3 is provided with the position detection switches Sw1 and Sw3 that respectively detect that the slide door 30 is at the fully closed position (see FIG. 1A) and the first open position (see FIG. 1B). Further, on the back side of the slide door 30, the protrusions Pt1 and Pt3 for operating the position detection switches that respectively correspond to the fully closed position and the first open position of the slide door 30 are provided. This allows the position detection switches Sw1 and Sw3 to be actuated in accordance with moving of the slide door 30, to detect that the slide door 30 is at the fully closed position and the first open position, respectively.

Figure 4C:
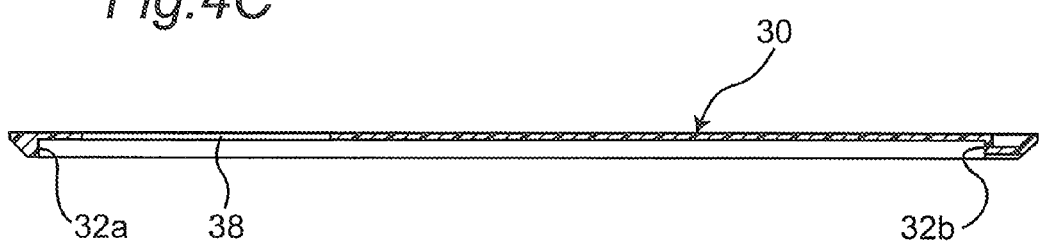
FIG. 4C is a schematic cross-sectional view of the slide door taken along a line Lc-Lc in FIG. 4A.

Further, on the back side of the slide door 30, at the position corresponding to, in terms of the top-bottom direction, the coming off prevention-purpose protrusion 3e provided at the front panel 3, abutting faces 32a and 32b are provided near the right and left opposite ends of the slide door 30 (see FIGS. 4A and 4C). When the slide door 30 slides toward the left side in FIG. 4A (the arrow $X_L$ direction), at the end of the sliding move, the abutting face 32b on the right end side abuts on the coming off prevention-purpose protrusion 3e and is stopped thereby; when the slide door 30 slides toward the right side (the arrow $X_R$ direction), at the end of the sliding move, the abutting face 32a on the left end side abuts on the coming off prevention-purpose protrusion 3e and is stopped thereby. Thus, the terminal positions of the sliding operation of the slide door 30 are determined, and the slide door 30 is prevented from coming off.

Figure 4D:
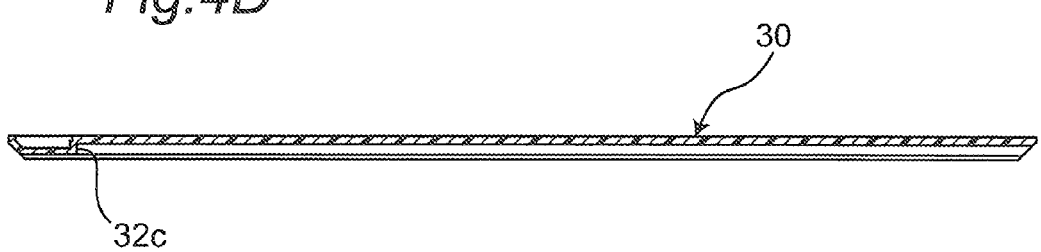
FIG. 4D is a schematic cross-sectional view of the slide door taken along a line Ld-Ld in FIG. 4A.

Still further, on the back side of the slide door 30, as will be described later, at the position corresponding to, in terms of the top-bottom direction, the tip portion of a second arm 56c of a switching lever 56 assembled into the driver unit 50, an abutting face 32c is provided near the left end of the slide door 30 (see FIGS. 4A and 4D). The abutting face 32c is positioned on the right side by a prescribed amount than the abutting face 32a on the left end side that acts when the sliding movement of the slide door 30 terminates. Then, when the slide door 30 slides to the right side in FIG. 4A (the arrow X direction) to move to the second open position (see FIG. 1C) where the front side of the PMP retaining mechanism 10 is opened, the abutting face 32c abuts on the tip portion of the second arm 56c of the switching lever 56 before the slide door 30 arrives at the end, thereby providing the switching lever 56 with the rotary force in a prescribed direction (e.g., the counterclockwise direction).

Figure 4E:
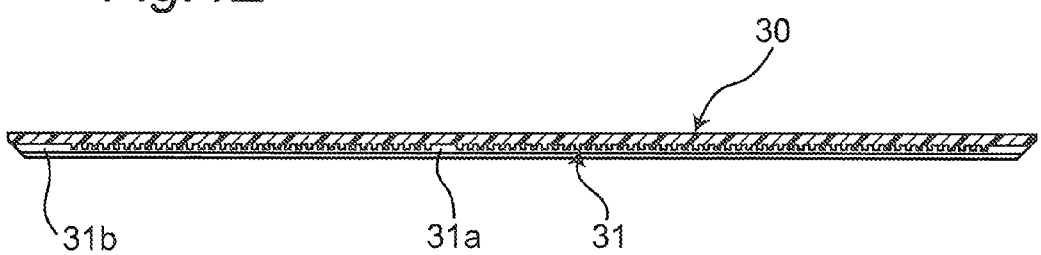
FIG. 4E is a schematic cross-sectional view of the slide door taken along a line Le-Le in FIG. 4A.

Still further, on the back side of the slide door 30, a driving rack gear 31 extending in the left-right direction (the arrows $X_L$ and $X_R$ direction) for driving the slide door 30 is arranged (see FIGS. 4A and 4E). The driving rack gear 31 meshes with a driving gear 70 (i.e., the first driving gear) assembled into the driver unit 50 as will be described later, and driven by the first driving gear 70.

At the substantially central portion of the rack gear 31, a central notch 31a with no gear tooth is provided. In the fully closed state of the slide door 30 (see FIG. 1A), the central notch 31a corresponds to the first driving gear 70, and the first driving gear 70 and the rack gear 31 become out of mesh. Further, the left end of the rack gear 31 also is provided with a left end notch 31b with no gear tooth. When the slide door 30 is at the second open position where the front side of the PMP retaining mechanism 10 is open (see FIG. 1C), the left end notch 31b corresponds to the first driving gear 70, and again the first driving gear 70 and the rack gear 31 become out of mesh.

Figure 4F:
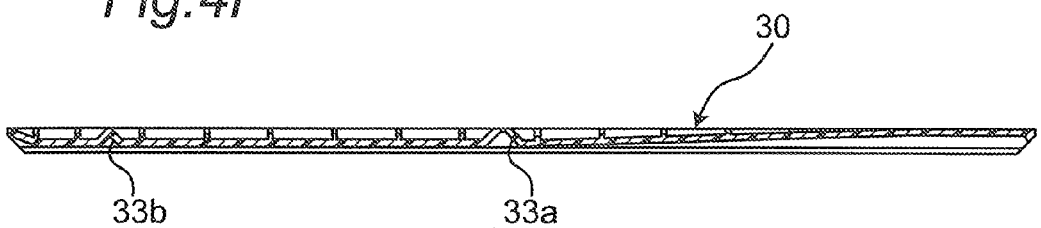
FIG. 4F is a schematic cross-sectional view of the slide door taken along a line Lf-Lf in FIG. 4A.
Figure 4G:
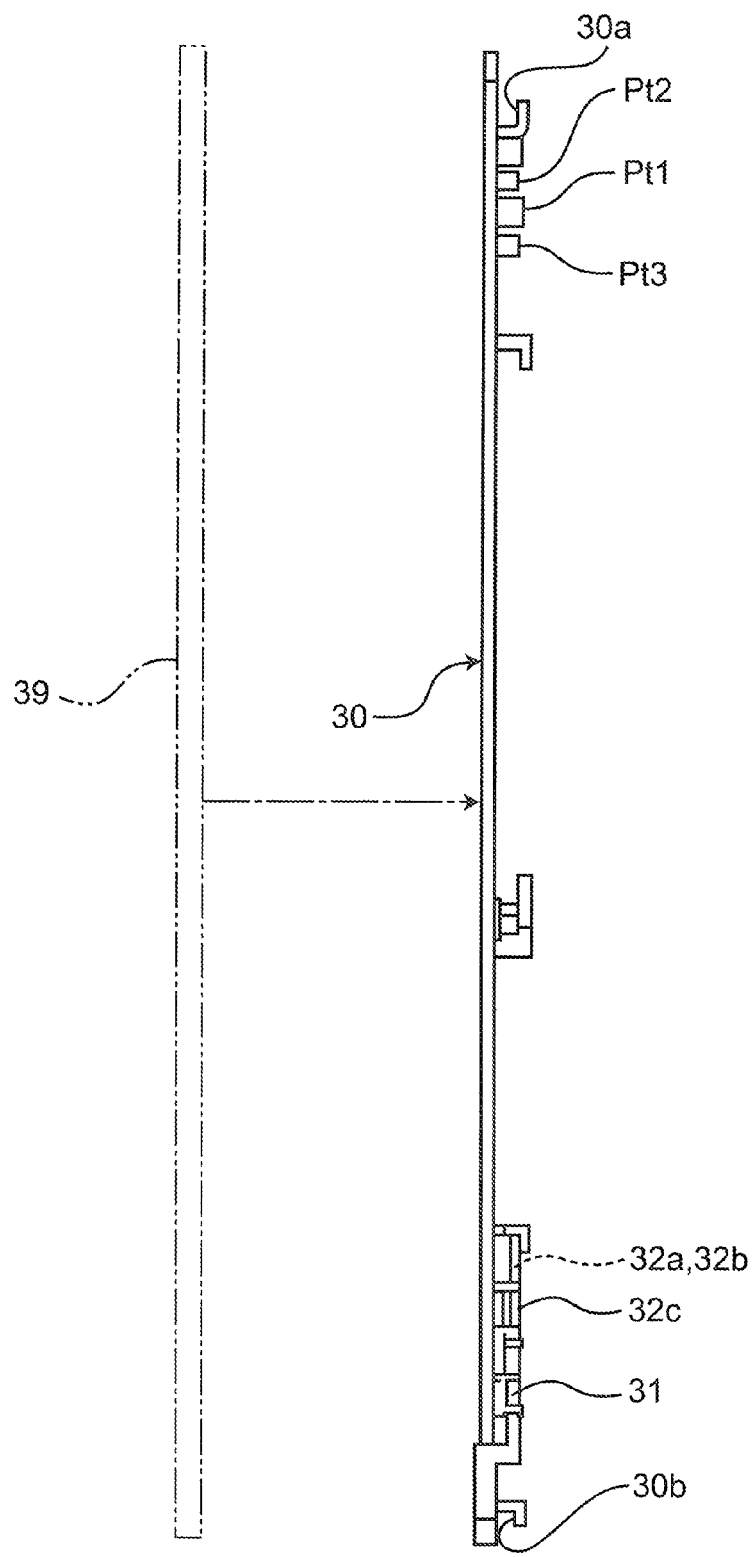
FIG. 4G is a view on arrow seen from an arrow Lg-arrow Lg direction in FIG. 4A.

Further, on the back side of the slide door 30, as will be described later, cam grooves 33a and 33b each having a slope face that can engage with a positioning piece 81 assembled into the driver unit 50 are formed (see FIGS. 4A and 4F).

On the front side of the slide door 30 structured as described above, the decoration plate 39 that is translucent, for example, is attached so as to cover and decorate the front side of the slide door 30 (see FIG. 4G).

Figure 5A:
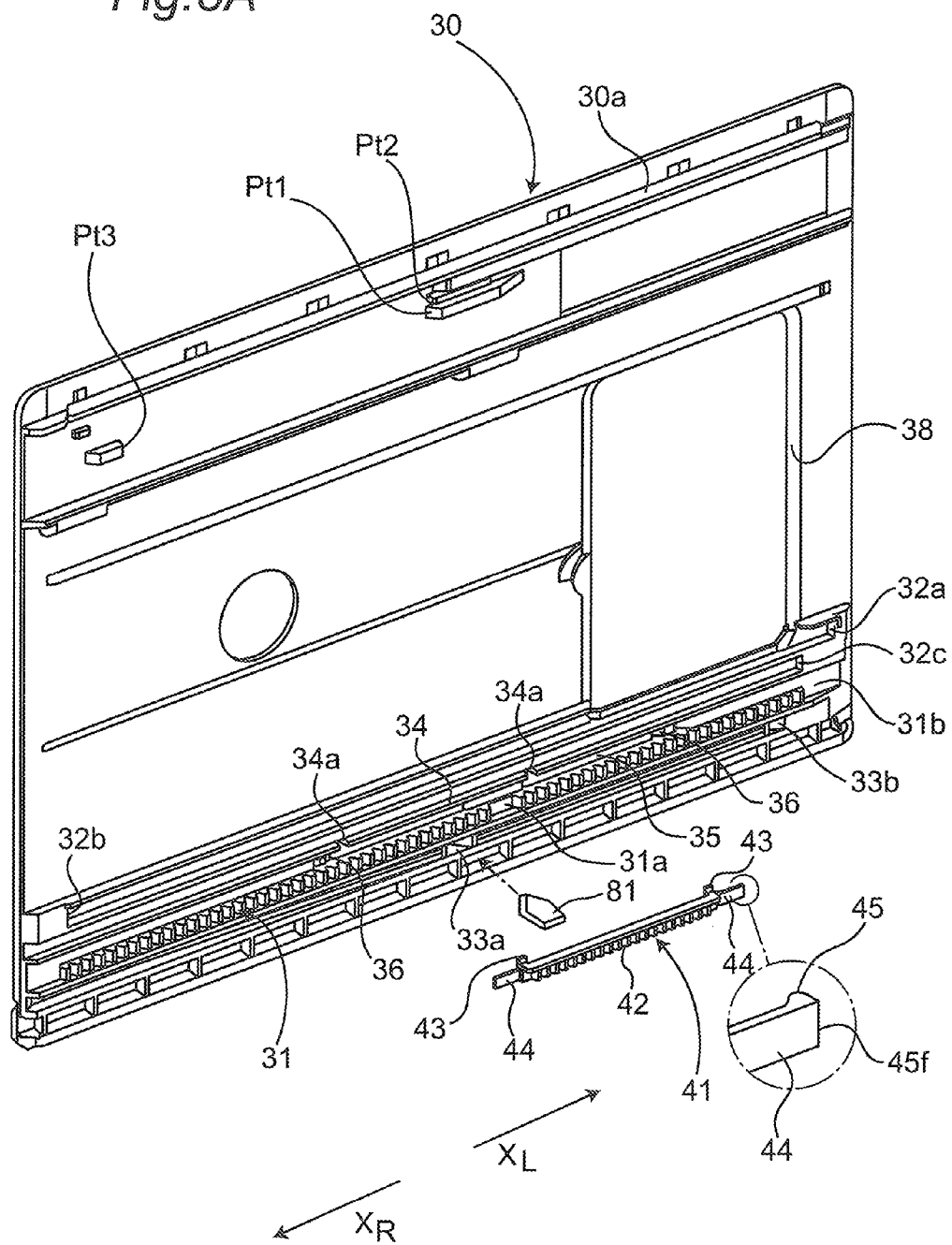
FIG. 5A is a perspective view showing the mounted state of an idle rack to the slide door as seen from the back side of the slide door.

Next, a description will be given of an idle rack 41 attached to the slide door 30. FIG. 5A is a perspective view showing the attaching manner of the idle rack 41 to the slide door 30 as seen from the back side of the slide door 30. Further, FIG. 5B is a cross-sectional view showing the assembled state of the idle rack 41 to the slide door 30 in an enlarged manner.

As shown in the drawings, the idle rack 41 extends along the driving rack gear 31 and is assembled into a space 35 above the driving rack gear 31. The idle rack 41 can freely slide in the left-right directions in the space 35 formed between a lateral wall 34 extending in the left-right direction on the back side of the slide door 30 and the top face of the driving rack gear 31. A rack gear 42 (idle rack gear) is provided at most of the idle rack 41 in the longitudinal direction. The module of the idle rack gear 42 is set to be identical to the module of the driving rack gear 31 of the slide door 30.

At each of the opposite ends of the idle rack gear 42, a hook portion 43 that projects in the top-bottom direction by a predetermined amount is formed. The hook portions 43 provide a slip-off preventing function of preventing the idle rack 41 from coming off from the slide door 30 to the back side when the idle rack 41 slides in the left-right directions along and on the top side of the driving rack gear 31. On the lateral wall 34, notches 34a and 34a corresponding to the hook portions 43 and 43 are formed. When the idle rack 41 is assembled into the back side of the slide door 30, the hook portions 43 and 43 are inserted from the notches 34a and 34a.

Figure 5B:
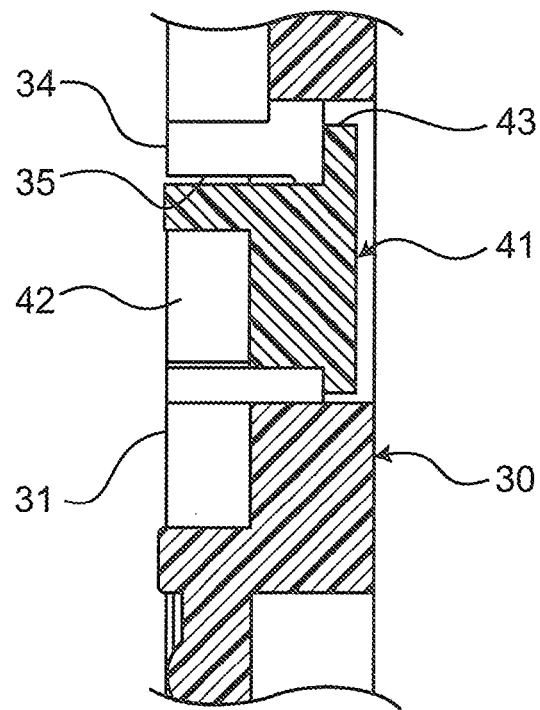
FIG. 5B is an enlarged cross-sectional view showing the assembled state of the idle rack into the slide door.

Thus, as shown in detail in FIG. 5B, the idle rack 41 can freely slide in the left-right directions (the direction perpendicular to the surface of FIG. 5B) in the space 35 between the lateral wall 34 and the top face of the driving rack gear 31. Further, by the hook portions 43 engaging with at least the lateral wall 34, the idle rack 41 can be surely prevented from coming off from the slide door 30 to the back side.

Further, on the right and left opposite ends of the idle rack 41, leaf portions 44 and 44 extending from the ends of the idle rack gear 42 in the longitudinal direction are respectively provided. At each end of the leaf portion 44, a cam-shaped portion 45 is formed.

Figure 5C:
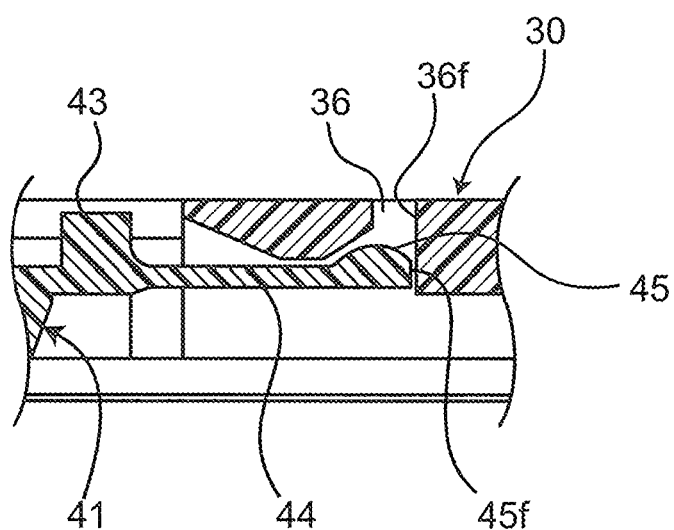
FIG. 5C is an enlarged cross-sectional view showing a cam-shaped portion of a leaf portion terminal of the idle rack is engaged with a groove on the backside of the slide door.

FIG. 5C is a cross-sectional view showing the state of the cam-shaped portion 45 being engaged with the groove 36 provided at the back side of the slide door 30 in an enlarged manner. When the idle rack 41 slides to move in the right direction in FIG. 5A, for example, it is set such that when the move ends, an end face 45f of the cam-shaped portion 45 abuts on a wall surface 36f of the groove 36, and the cam-shaped portion 45 enters inside the groove 36 to be retained by that position under the light spring pressure of the leaf portion 44.

Figure 6C:
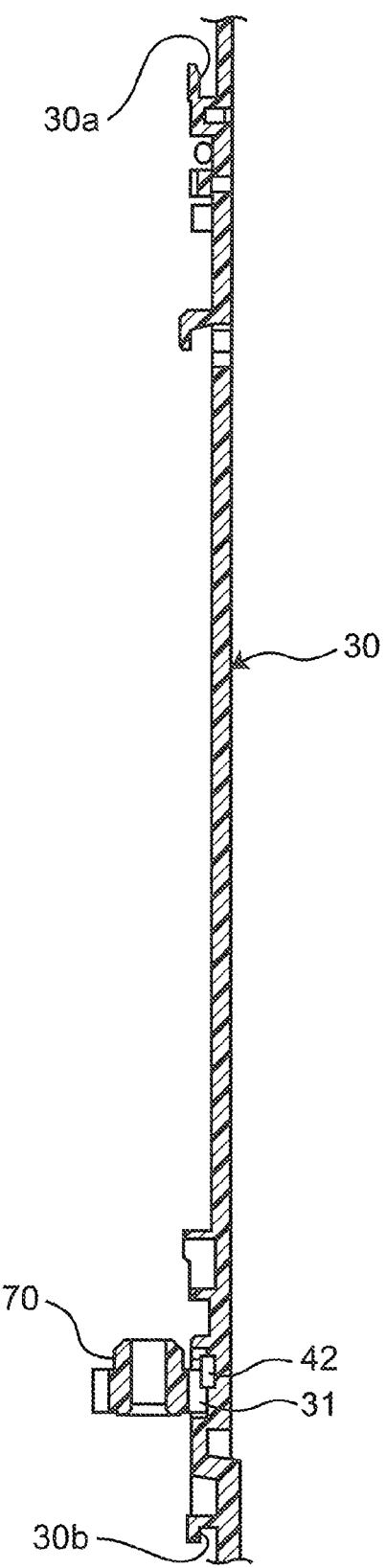
FIG. 6C is a vertical cross-sectional view showing the positional relationship of the driving rack gear and the idle rack gear for the slide door, to a first driving gear of the driver unit.

FIGS. 6A and 6B each show the positional relationship between the driving rack gear 31 and the idle rack 41. In each of the drawings, (a) is a plan view of the slide door 30, and (b) is a rear view of the slide door 30. Further, FIG. 6C is a cross-sectional view showing the positional relationship between the driving rack gear 31 and the idle rack gear 42 of the slide door 230 and the first driving gear 70 of the driver unit 50.

FIG. 6A shows the state where the idle rack 41 moves in the arrow $X_R$ direction, and the end face 45f of the cam-shaped portion 45 of the idle rack 41 abuts on the wall surface 36f of the groove 36 of the slide door 30. It is structured such that, in this state, the driving rack gear 31 of the slide door 30 and the idle rack gear 42 of the idle rack 41 are in phase.

As can be clearly seen from FIG. 6C, the tooth of the first driving gear 70 have their position in top-bottom direction and dimension set such that they can mesh with both the driving rack gear 31 and the idle rack 41. For example, the top-bottom direction dimension of the tooth of the first driving gear 70 is more preferably set to be greater than the top-bottom direction dimension of the driving rack gear 31.

With such a structure, as to the tooth-lacking portion of the central notch 31a of the driving rack gear 31 of the slide door 30 also, by the idle rack gear 42 meshing with the first driving gear 70, the meshing relationship of the gears can be continuously maintained between the driver unit 50 side and the slide door 30 side.

FIG. 6B shows the state where the idle rack 41 moves in the arrow $X_L$ direction and, similarly to the state shown in FIG. 6A, the end face 45f of the cam-shaped portion 45 of the idle rack 41 abuts on the wall surface 36f of the groove 36 of the slide door 30. It is also structured such that, in this state, the driving rack gear 31 of the slide door 30 and the idle rack gear 42 of the idle rack 41 are in phase. Further, similarly to the case shown in FIG. 6A, as to the tooth-lacking portion of the left end notch 31b of the driving rack gear 31 of the slide door 30, by the idle rack gear 42 meshing with the first driving gear 70, the meshing relationship of the gears can be continuously maintained between the driver unit 50 side and the slide door 30 side.

With reference chiefly to FIGS. 6A and 6B, a description will be given of the operation of the idle rack 41 thus structured.

In the state of FIG. 6A, by the positioning piece 81 engaging with the cam groove 33a formed on the back side of the slide door 30, the central notch 31a corresponds to the first driving gear 70, and the first driving gear 70 and the driving rack gear 31 are out of mesh. However, since the idle rack gear 42 and the first driving gear 70 mesh with each other, when the first driving gear 70 is rotated in the clockwise direction (CW direction) in FIG. 6A (a), while the slide door 30 is kept stationary, the idle rack 41 moves in the arrow $X_L$ direction, to enter the state shown in FIG. 6B.

When the first driving gear 70 is further continuously rotated in the clockwise direction (CW direction), the end face 45f of the cam-shaped portion 45 of the idle rack 41 abuts on the wall surface 36f of the groove 36 of the slide door 30, and the rotary drive force of the motor is transmitted to the slide door 30 via the first driving gear 70 and the idle rack 41. This causes the slide door 30 side to move in the arrow $X_L$ direction, to be brought at the first open position (see FIG. 1B) where the disc 5 can be attached or removed.

In order to cause the slide door 30 to move from the first open state where the CD 5 can be attached or removed (see FIG. 1B) or the second open state where the PMP 6 can be attached or removed (see FIG. 1C) to the fully closed position (see FIG. 1A), and to be stopped there, an accurate stop operation is required.

In the case where the driving rack gear 31 of the slide door 30 is not provided with the central notch 31a, the rotation of motor is stopped by a motor stop signal output from the fully closed position detection switch, however, the stop position of the slide door 30 will not be stable due to overrun by the inertia of the rotor of the motor, or changes in the brake load attributed to variations in the load of the slide door 30.

In the present embodiment, the driving rack gear 31 of the slide door 30 is provided with the central notch 31a, with which the positioning piece 81 is associated, whereby the accurate stop operation when the slide door 30 is totally closed is realized. A description will be given of this stop operation, taking up an exemplary case where the slide door 30 is moved from the second open state where the PMP 6 can be attached or removed (see FIG. 1C) to the fully closed position (see FIG. 1A).

When the first driving gear 70 is rotated in the clockwise direction (CW direction), the slide door 30 is moved in the arrow $X_L$ direction by the driving rack gear 31. When the central notch 31a passes the rack gear end, the first driving gear 70 and the driving rack gear 31 becomes out of mesh, which disconnects the gear transmission. At this point, the positioning piece 81 engages with the cam groove 33a along the slope face of the cam groove 33a, and the slide door 30 stops at the center position by the biasing force of the spring acting on the positioning piece 81.

At this time, since the rotor of the motor is rotating by inertia, the idle rack 41 moves in the arrow $X_L$ direction, however, the slide door 30 can stay in the stopped state at the center position corresponding to the fully closed position. That is, setting the rotation amount by inertia of the motor about half the length of the idle rack gear 42, the slide door 30 can be easily centered without being affected by the overrun due to the motor inertia or variations in the brake load. As to the moving mode from the first open state where the CD 5 can be attached or removed (see FIG. 1B) to the fully closed position (see FIG. 1A) also, centering can be performed based on the same principle as described in the foregoing.

Figure 7A:
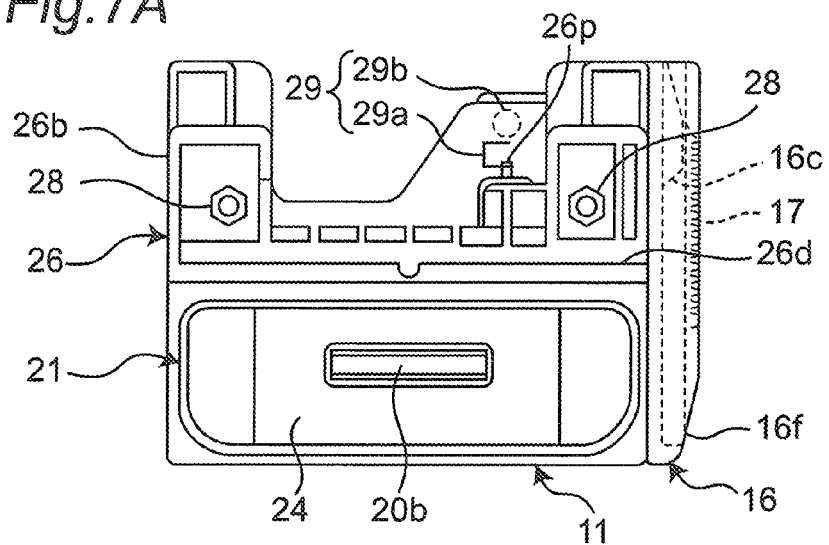
FIG. 7A is a plan view schematically showing the structure of the PMP retaining mechanism.
Figure 7B:
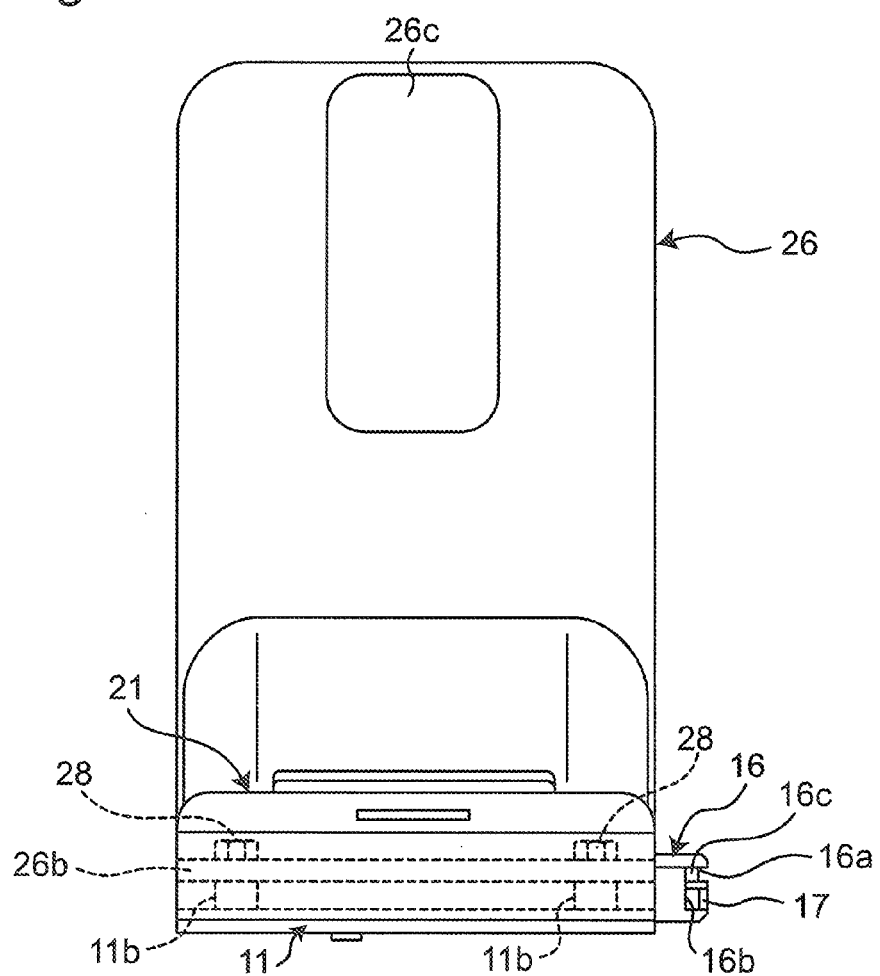
FIG. 7B is a front view schematically showing the structure of the PMP retaining mechanism.
Figure 8:
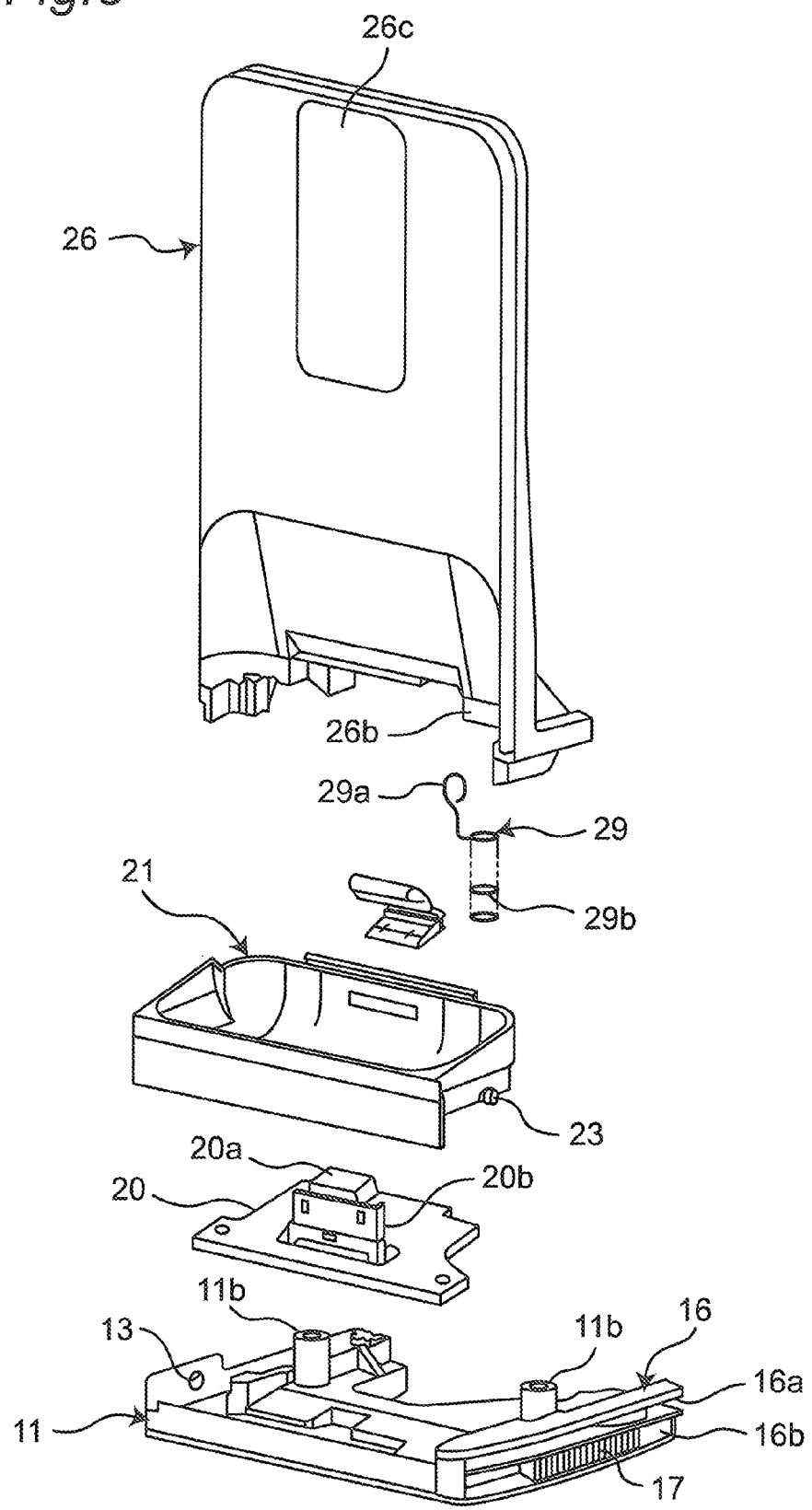
FIG. 8 is an exploded perspective view schematically showing the structure of the PMP retaining mechanism.

Next, a description will be given of the PMP retaining mechanism 10. FIGS. 7A, 7B and 7C are respectively a plan view, a front view, and a side view each schematically showing the structure of the PMP retaining mechanism 10. Further, FIG. 8 is an exploded perspective view schematically showing the structure of the PMP retaining mechanism 10.

As shown in the drawings, the PMP retaining mechanism 10 includes, as basic constituents, a base pedestal 11 that serves as the base for the entire PMP retaining mechanism 10, a drive side portion 16 that receives the drive force from the driver unit 50, a terminal block 21 that supports the bottom of the PMP 6, and a back supporter 26 that serves as a backrest supporting the back of the PMP 6.

The base pedestal 11 is positioned at the bottommost in the PMP retaining mechanism 10, and the drive side portion 16 is integrally formed at the side portion (the right side portion in the drawings) thereof. Further, the terminal block 21 is assembled immediately above the base pedestal 11. On the terminal block 21, the back supporter 26 is arranged.

The PMP retaining mechanism 10 assembled in this manner is accommodated in the recess portion 3c at a portion recessed by a predetermined depth from the surface 3f of the front panel 3, so that it can move by a predetermined amount in the front and rear directions (in the directions of arrows $Y_F$ and $Y_R$) (see FIG. 2).

On the bottom side of the terminal block 21, a printed circuit board 20 including a connector 20a and a connector terminal 20b is assembled, and the connector terminal 20b provided upright at the top of the printed circuit board 20 penetrates the floor of the terminal block 21 and projects upward. The PMP 6 has its terminal socket portion (not shown) at its bottom portion fitted to the connector terminal 20b. When the PMP 6 is placed on the terminal block 21 in this state, the PMP 6 is electrically connected to the printed circuit board 20, and is electrically connected to the reproduction portion (not shown) of the PMP reproduction unit U1 via the connector 20a.

In the present embodiment, more preferably, a reflecting mirror 24 is bonded to the bottom of the terminal block 21. When the user mount the PMP 6 on the terminal block 21, the terminal socket portion at the bottom portion of the PMP 6 is reflected upon the reflecting mirror 24. This makes it possible for the user to visually recognize the portion to be connected to the connector terminal 20b (i.e., the terminal socket portion of the PMP 6) from the insertion direction of the PMP 6 (from above), thereby facilitating fitting to the connector terminal 20b. Thus, the attachment workability of the PMP 6 can be remarkably improved.

On the right and left side portions at the relatively bottom portion of the terminal block 21, rotary pivots 23 and 23 that are, for example, pin-like, projecting outward are provided. At the right and left inner wall portions of the base pedestal 11, holes 13 and 13 are formed. They allow the rotary pivots 23 and 23 to rotatably fit thereto. By allowing the rotary pivots 23 and 23 of the terminal block 21 to rotatably fit into the holes 13 and 13 of the base pedestal 11, the terminal block 21 is assembled to the base pedestal 11 so as to be capable of swinging in the top-bottom directions.

The back supporter 26 serves as a backrest that supports the back of the PMP 6 mounted on the terminal block 21. At the relatively top portion on the front side thereof, a cushion member 26c is bonded. The bottom base 26b is fastened to boss portions 11b and 11b provided upright at the bottom of the base pedestal 11 with a use of screw members 28 and 28.

Between the back face of the terminal block 21 and the back face of the back supporter 26, a spring 29 that is, for example, coil-like, is attached. A body portion 29b of the spring 29 is attached to the back side of the terminal block 21, and a top end portion 29a of the spring 29 is engaged with a pin 26p that projects from the back face of the back supporter 26. To the terminal block 21, by the biasing operation of the spring 29, rotary force about the rotary pivots 23 and 23 in the direction in which the front portion of the terminal block 21 rotates upwardly is constantly applied. Accordingly, when the PMP 6 is mounted on the terminal block 21, the upper back face of the PMP 6 is pressed against the cushion member 26c bonded to the front surface of the back supporter 26, and the PMP 6 can be stably retained.

The drive side portion 16 that is integrally formed by the side of the base pedestal 11 (the right side in the drawings) is provided with an upper and a lower parallel grooves 16a and 16b that extend in the front and rear directions (the directions of arrows $Y_F$ and $Y_R$). The grooves 16a and 16b are open on their outer side (the right side in the drawings). At the relatively rear portion of the upper groove 16a, a cam-shaped portion 16c having an overhang portion that extends toward the outside and slope faces at the front and rear sides of the overhang portion is formed. The upper groove 16a is provided at the position that can engage with the tip portion of a first arm 57a of a switch lever 57 assembled into the driver unit 50, which will be described later.

At the central portion of the lower groove 16b in the front and rear directions, a rack gear 17 (a side rack gear) that can engage with a driving gear 76 (a second driving gear) assembled into the driver unit 50, as will be described later, is provided along the groove 16b. Accordingly, by the side rack gear 17 being driven in the front and rear directions (the directions of arrows $Y_F$ and $Y_R$) by the rotation of the second driving gear 76, the base pedestal 11 (hence the whole PMP retaining mechanism 10) is driven in the front and rear directions. It is to be noted that there are portions (notches) with no rack tooth in front and back of the side rack gear 17.

As described in the foregoing, the PMP retaining mechanism 10 is accommodated in the recess portion 3c that is recessed by a predetermined depth from the surface 3f of the front panel 3. In the state where the front side of the PMP reproduction unit U2 is covered by the slide door 30, the PMP retaining mechanism 10 is positioned on the deeper side than the slide door 30, that is, at the accommodation position on the rear side (in the arrow $Y_R$ direction). It is structured such that, in this state, the front side of the base pedestal 11 and the front side of the terminal block 21 are surely positioned on the rear side than the back side of the slide door 30, so that interference between them is surely avoided.

Further, it is structured such that, when the slide door 30 is moved to uncover the front side of the PMP retaining mechanism 10, in association with the moving operation of the slide door 30, the PMP retaining mechanism 10 is drawn from the accommodation position toward the front side (the arrow $Y_F$ direction), to arrive at the draw out position (see FIG. 1C). In this draw out state, it is set such that the supporting face (the front side) of the back supporter 26 is substantially flush with the surface 3f of the front panel 3, whereby attachment or removal of the PMP 6 to or from the PMP retaining mechanism 10 can be easily performed.

Figure 9A:
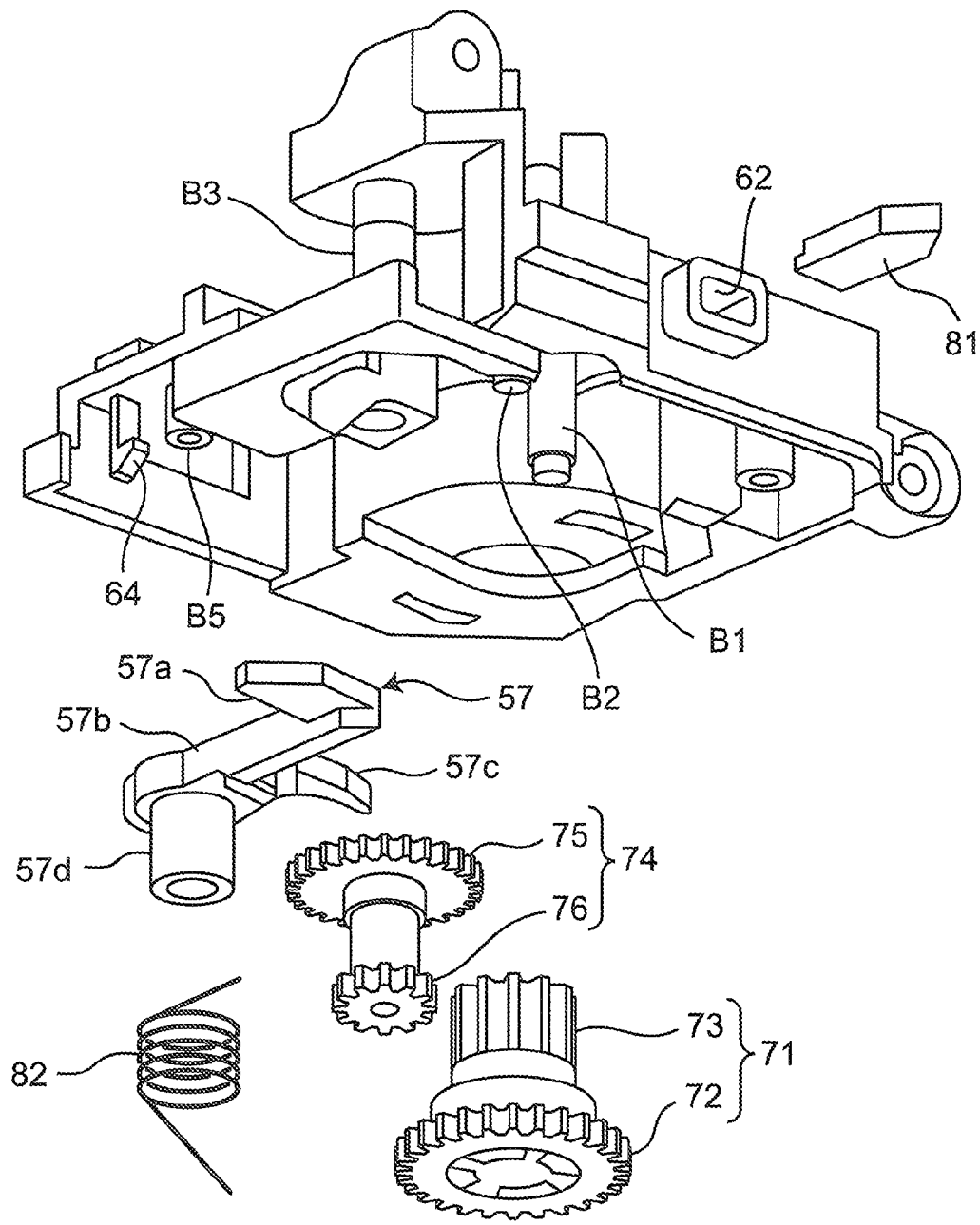
FIG. 9A is a perspective view as seen from diagonally below showing the schematic structure of the bottom side portion of the driver unit.
Figure 9B:
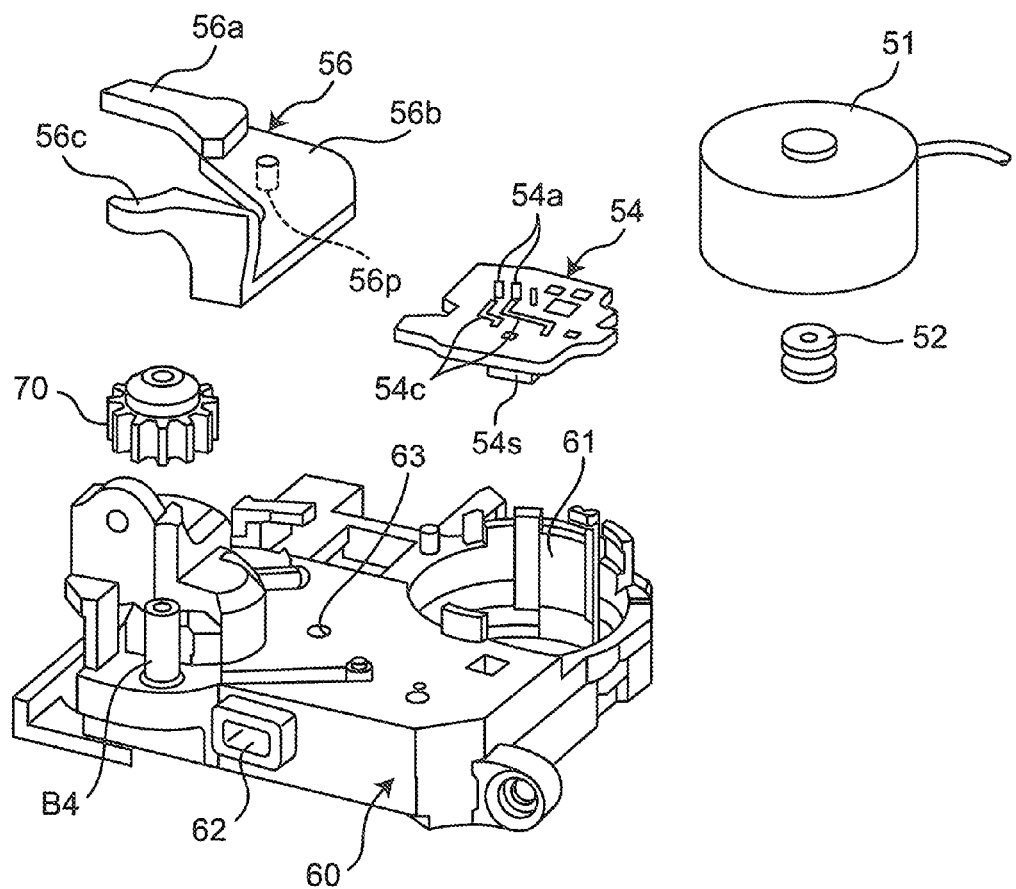
FIG. 9B is a perspective view as seen from diagonally above showing the schematic structure of the top side portion of the driver unit.
Figure 9C:
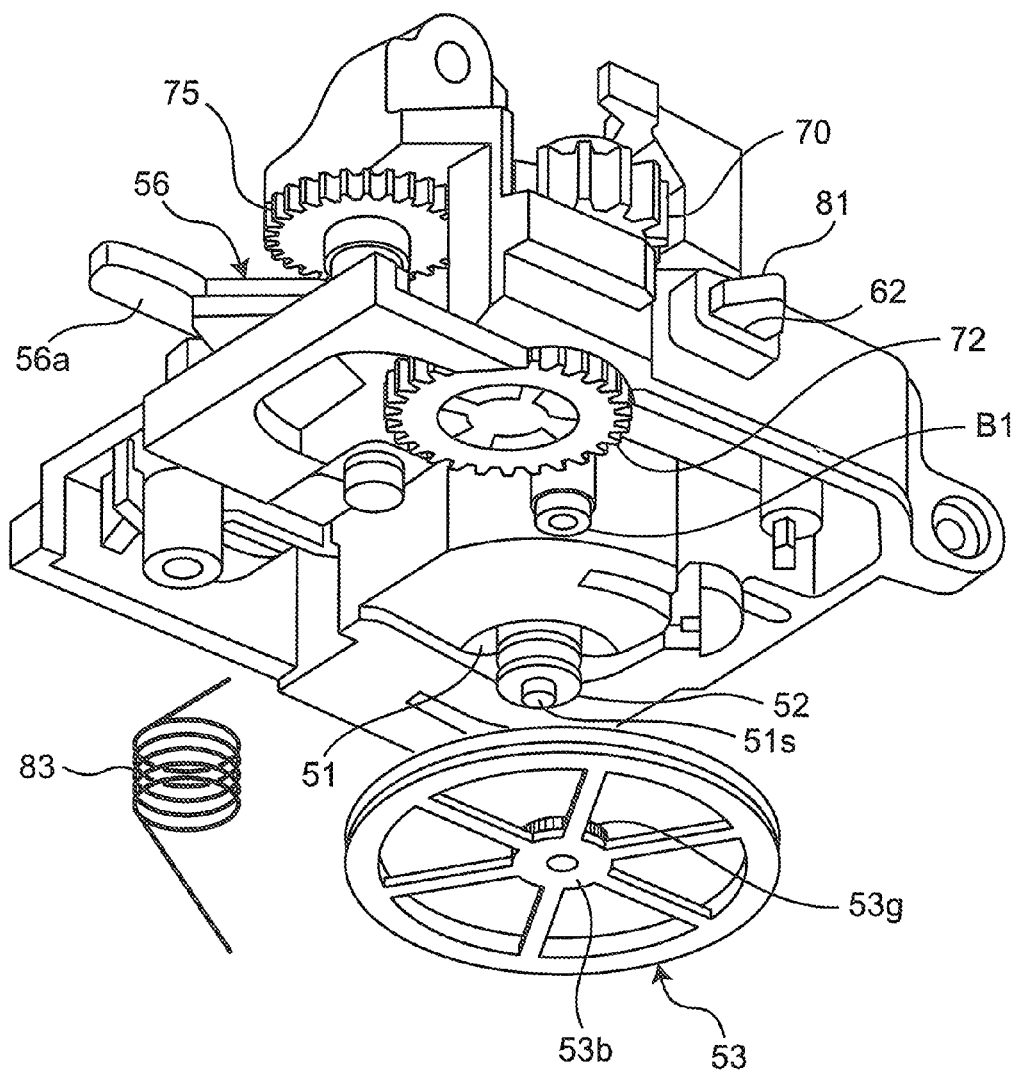
FIG. 9C is a perspective view as seen from diagonally below schematically showing the state of the driver unit before completely assembled.

Next, a description will be given of the driver unit 50. FIG. 9A is a perspective view as seen from diagonally below showing the schematic structure of the bottom side portion of the driver unit 50. FIG. 9B is a perspective view as seen from diagonally above showing the schematic structure of the top side portion of the driver unit 50. Further, FIG. 9C is a perspective view as seen from diagonally below showing the state of the driver unit 50 before assembly is completed.

As shown in the drawings, the driver unit 50 includes a base element (unit base) 60 into which basic constituents of the unit 50 are assembled. The unit base 60 whose overall shape is substantially square in planar view, and has assembly portions formed at its top, bottom, and side faces into which various constituents are assembled.

When the constituents are assembled into the unit base 60, for example, firstly, prescribed constituents are assembled into the bottom side of the unit base 60 (see FIG. 9A). Next, prescribed constituents are assembled on the top side of the unit base 60 (see FIG. 9B). Finally, assembly of the bottom side portion of the unit base 60 is performed (see FIG. 9C), to complete the assembly of the driver unit 50.

On the top side of the unit base 60, a concave portion 61 whose circumferential shape is formed to be a circular shape of a predetermined diameter (see FIG. 9B). In this concave portion 61, the electric motor 51 as the drive source is accommodated. Further, on the top side of the unit base 60, a printed circuit board 54 is assembled relatively near the electric motor 51. The printed circuit board 54 includes a connector 54a and a circuit portion 54c for exerting control and the like. On the bottom side of the printed circuit board 54, a position detection-purpose switch 54s is attached. This position detection switch 54s is to detect the state in which the PMP retaining mechanism 10 moves frontward (in the arrow $Y_F$ direction in FIGS. 1A to 1C and the like) to arrive at an advanced position by at least a certain degree. A detection signal is provided to the circuit portion 54c via the connector 54a. This position detection will be detailed later.

An output shaft 51s of the electric motor 51 projects from the bottom side of the unit base 60. A driving pulley 52 of a small diameter is coupled to the output shaft 51s (see FIG. 9C). This driving pulley 52 is linked to a driven pulley 53 of a large diameter via a transmission belt (not shown). This driven pulley 53 is rotatably supported by a boss portion B1 that is suspended from the unit base 60. The rotary force of the motor 51 is transmitted to the driven pulley 53, while the rotary speed of the motor 51 is decelerated in accordance with the diameter ratio between the driving pulley 52 and the driven pulley 53. At the top portion of a central boss portion 53b of the driven pulley 53, a gear portion 53g (a pulley gear) having a predetermined diameter is formed. This pulley gear 53g is provided with tooth along its outer circumference.

The pulley gear 53g of the driven pulley 53 meshes with an input gear 72 of a first gear set 71 which is structured by coaxial input gear 72 and output gear 73 arranged in an upper-lower direction (see FIG. 9A). This first gear set 71 is rotatably supported by a boss portion B2 that is suspended from the unit base 60. The input gear 72 of the first gear set 71 is designed to have a greater diameter than the pulley gear 53g. The rotary force of the motor 51 is transmitted to the first gear set 71, while the rotary speed of the motor 51 is further decelerated in accordance with the gear ratio between the input gear 72 and the pulley gear 53g.

The output gear 73 of the first gear set 71 is positioned on the top side of the unit base 60. The output gear 73 meshes with an input gear 75 of a second gear set 74, and at the same time, meshes with the driving gear 70 (the first driving gear) that can mesh with the driving rack gear 31 on the back side of the slide door 30. This first driving gear 70 is rotatably supported by the boss portion B4 (see FIG. 9B) provided upright on the unit base 60.

The second gear set 74 is arranged in parallel to the first gear set 71, and is structured by coaxial input gear 75 and output gear 76. The second gear set 74 is rotatably supported by a boss portion B3 (see FIG. 9A) that is arranged on the top side of the unit base 60. The output gear 76 of the second gear set 74 is smaller in diameter than the input gear 75, and located at a position in the upper-lower direction corresponding to the lower groove 16b of the drive side portion 16 in the PMP retaining mechanism 10. The output gear 76 can mesh with the side rack gear 17 formed in the lower groove 16b.

That is, the output gear 76 of the second gear set 74 functions as the driving gear (the second driving gear) that can mesh with the side rack gear 17 of the PMP retaining mechanism 10 to thereby drive the PMP retaining mechanism 10 in the front and rear directions (in the directions of arrows $Y_F$ and $Y_R$).

Here, with reference to FIGS. 9D to 9G, a description will be given of an assembly structure in which the rotary elements such as the driven pulley 53, the first gear set 71, the second gear set 74 and the like are assembled into the tip side of the boss portions B1, B2, and B3 as hollow shafts provided upright on the unit base (pedestal) 60 so as to be freely rotatable about the corresponding boss portions B1, B2, and B3.

Figure 9D:
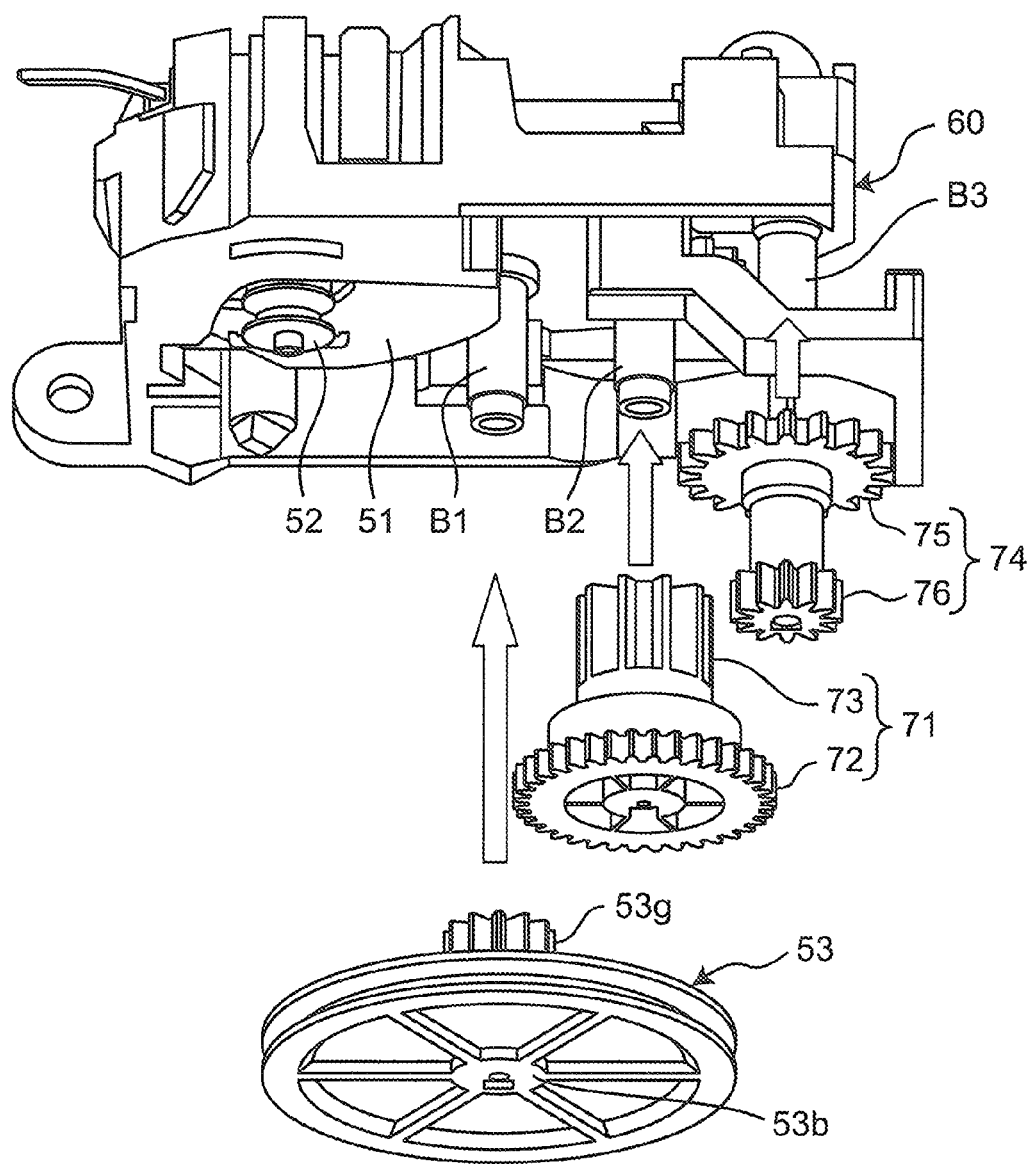
FIG. 9D is a perspective view as seen from diagonally below schematically showing the state of the driver unit before assembled.
Figure 9E:
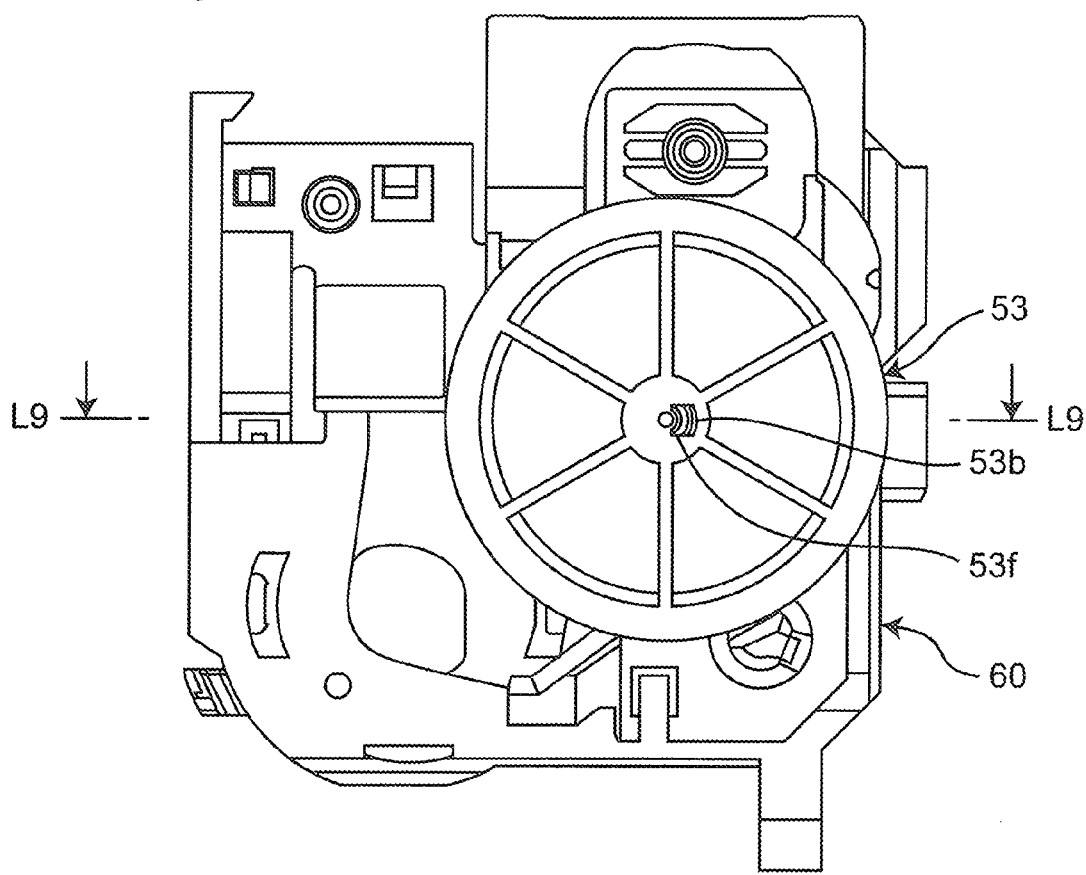
FIG. 9E is a bottom view schematically showing the state of a driven pulley before assembled into a boss portion.
Figure 9F:
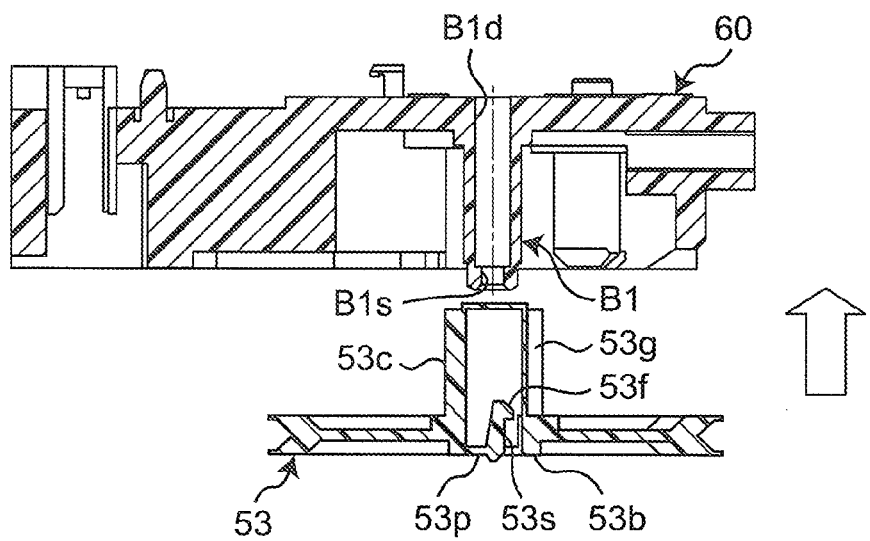
FIG. 9F is a schematic cross-sectional view of the driven pulley and the boss portion taken along a line L9-L9 in FIG. 9E.

FIG. 9D is a perspective view as seen from diagonally below showing the state of the driver unit 50 before being assembled. FIG. 9E is a bottom view showing the state of the driven pulley 53 before being assembled into the boss portion. FIG. 9F is a cross-sectional view taken along a line L9-L9 in FIG. 9E. Further, FIG. 9G is a cross-sectional view showing the chief part of the assembly structure of the driven pulley 53 being assembled into the boss portion in an enlarged manner.

In the present embodiment, in rotatably assembling the rotary elements (the driven pulley 53, the first gear set 71, and the second gear set 74) to the tip side of the hollow shafts (the boss portions B1, B2, and B3), the rotary elements can be rotatably assembled to the tip side of the hollow shaft, without using any screw mechanism, and while surely preventing the rotary elements from coming off. The assembly structure of each of the three rotary elements (the driven pulley 53, the first gear set 71, and the second gear set 74) to the tip side of the hollow shafts (the boss portions B1, B2, and B3) is basically identical. Therefore, in the following, with reference chiefly to FIGS. 9E to 9G, a description will be given of the assembly structure in which the driven pulley 53 is assembled to the tip side of the boss portion B1, as representative example.

The boss portion B1 provided upright on the unit base 60 has a hollow structure. On the tip side, a small diameter portion B1s being smaller in diameter than a hollow portion B1d of the boss portion B1 is provided. It is to be noted that, in the present embodiment, the unit base 60 and the boss portion B1 formed integrally with the unit base 60 are obtained by molding process using synthetic resin as the material.

Further, the driven pulley 53 is also made of synthetic resin. A rotation center portion 53b of the driven pulley 53 is provided with a cylindrical portion 53c having an inner circumferential portion fitting to the outer circumferential portion of the boss portion B1. The pulley gear 53g is formed at the outer circumferential portion of this cylindrical portion 53c. Provided inside the cylindrical portion 53c is a hook strut portion 53s that has a hook portion 53f overhanging in the radial direction on the tip side thereof and that extends substantially along the fitting direction (see the outlined arrows in FIGS. 9D, 9F, and 9G) to the boss portion B1. The base end portion of the hook strut portion 53s and the base end portion of the cylindrical portion 53c are coupled with each other by a resin-made thin plate portion 53p. The center of the base end portion of the hook strut portion 53s is preferably positioned on the substantially center line Jr of the cylindrical portion 53c (substantively the rotation center line of the driven pulley 53). Further, the radius of the overhang tip portion 53t of the hook portion 53f is set to be greater than the radius of the small diameter portion B1s of the boss portion B1 and to be smaller than the radius of the hollow portion B1d.

Inside the boss portion B1, since the small diameter portion B1s smaller in diameter than the hollow portion B1d is provided on the tip side, a stepped portion B1k is formed by the hollow portion B1d and the small diameter portion B1s. The stepped portion B1k is preferably set such that the inner circumferential side is positioned on the fitting direction (see outlined arrows in FIGS. 9D, 9F, and 9G) side than the outer circumferential side, relative to the boss portion B1 of the cylindrical portion 53c.

For example, as shown in the partial enlarged view of FIG. 9G, by structuring the stepped portion B1k with a slope face, and setting this slope face to tilt by an angle $\alpha$ which is smaller than 90 degrees (e.g., $\alpha$=80 degrees) with reference to the direction parallel to the rotation center line Jr, the inner circumferential side can be set to position on the fitting direction side than the outer circumferential side, relative to the boss portion B1 of the cylindrical portion 53c. Alternatively, it is also possible to structure the stepped portion B1k with a flat face that is substantially perpendicular to the direction parallel to the rotation center line Jr, and to form a protrusion at the inner circumferential portion of the flat face that protrudes by a prescribed amount in the fitting direction.

As will be described later, in the state where the driven pulley 53 is assembled into the boss portion B1, the hook portion 53f engages with the stepped portion B1k of the boss portion B1. More preferably, the engaging portion 53k with the stepped portion B1k is also set such that the inner side is positioned on the fitting direction (see outlined arrows in FIGS. 9D, 9F, and 9G) side than the outer side.

For example, as shown in the partial enlarged view in FIG. 9G, by structuring the engaging portion 53k with a slope face, and setting the slope face to tilt by an angle $\beta$ which is smaller than 90 degrees (e.g., $\beta=\alpha$=80 degrees) with reference to the direction parallel to the rotation center line Jr, the inner side can be set to position on the fitting direction side than the outer side, relative to the boss portion B1 of the cylindrical portion 53c. It is to be noted that, as to the magnitude relationship between angle $\beta$ and angle $\alpha$, when it is not $\beta=\alpha$ as described above, $\beta<\alpha$ is preferable than $\beta>\alpha$. Further, instead of forming the engaging portion 53k with a slope face, it is also possible to structure the engaging portion 53k with a flat face that is substantially perpendicular to the direction parallel to the rotation center line Jr, and to form a protrusion on the outer side of the flat face that protrudes by a prescribed amount in the direction opposite to the fitting direction.

When the driven pulley 53 is assembled to the tip side of the boss portion B1, by fitting the cylindrical portion 53c of the driven pulley 53 to the boss portion B1, the hook portion 53f on the tip side of the hook strut portion 53s is pressed into the hollow portion B1d via the small diameter portion B1s on the tip side of the boss portion B1, and the hook portion 53f engages with the stepped portion B1k formed by the hollow portion B1d and the small diameter portion B1s.

As has been described in the foregoing, the base end portion of the hook strut portion 53s of the driven pulley 53 and the base end portion of the cylindrical portion 53c is coupled with each other by the resin-made thin plate portion 53p. When the cylindrical portion 53c of the driven pulley 53 is fitted from the tip side of the boss portion B1, the hook portion 53f penetrates through the small diameter portion B1s while having its slope face on the tip side pressed by the small diameter portion B1s of the boss portion B1. Here, it is structured such that the thin plate portion 53p and the hook strut portion 53s appropriately bend so that the hook portion 53f can penetrate through the small diameter portion B1s without any trouble.

In the present embodiment, after the hook portion 53f of the driven pulley 53 is thus inserted to penetrate through the small diameter portion B1s of the boss portion B1, as described above, the hook portion 53f of the cylindrical portion 53c of the driven pulley 53 engages with the stepped portion B1k formed with the hollow portion B1d of the boss portion B1 and the small diameter portion B1s. This prevents the driven pulley 53 from coming off from the boss portion B1.

That is, in rotatably assembling the driven pulley 53 on the tip side of the boss portion B1, the driven pulley 53 can be rotatably assembled to the tip side of the boss portion B1 without using any screw mechanism and while surely preventing the driven pulley 53 from coming off. Thus, an improvement in workability in the assembly step and a reduction in the number of components can be achieved. Further, it becomes possible to eliminate occurrence of possible trouble such as bulge, crack, or breakage at the tip side of the boss portion B1 which may otherwise occur when a screw mechanism is used.

Here, as to the stepped portion B1k in the boss portion B1 with which the hook portion 53f of the driven pulley 53 engages, since the inner circumferential side positions on the fitting direction side than the outer circumferential side relative to the boss portion B1 of the cylindrical portion 53c, the engagement of the hook portion 53f with the stepped portion 53k will not be easily disengaged, and the effect of preventing the driven pulley 53 from coming off from the boss portion B1 is further improved.

Further, since the engaging portion 53k which engages with the stepped portion B1k of the hook portion 53f has its inner side positioned on the fitting direction side than the outer side, the engagement of the hook portion 53f with the stepped portion B1k will not be easily disengaged, and the effect of preventing the driven pulley 53 from coming off from the boss portion B1 is further enhanced.

In special, by structuring both the engaging portion 53k of the hook portion 53f with the stepped portion B1k and the stepped portion B1k as described in the foregoing, in the assembled state, a so-called "wedge structure" is formed between them. Therefore, disengagement will not easily occur.

Further, at the outer circumferential portion of the boss portion B1, an abutment receiving portion B1e is provided. The abutment receiving portion B1e is to stop and receive a tip portion 53e of the cylindrical portion 53c when the cylindrical portion 53c of the driven pulley 53 is fitted. It is structured such that, when the driven pulley 53 is assembled to the tip side of the boss portion B1, in the state where the tip portion 53e of the cylindrical portion 53c abuts on and stopped by the abutment receiving portion B1e, a gap Dc (see the partial enlarged view of FIG. 9G) exists between the tip portion of the boss portion B1 and the thin plate portion 53p. The existence of the gap Dc ensures the free rotation of the driven pulley 53 about the tip side portion of the boss portion B1 with the simple structure.

In the present embodiment, further, at the outer circumferential portion on the tip side of the boss portion B1, a small diameter portion 53d whose outer diameter is set to be smaller by a prescribed amount is provided in a range Sd (see the partial enlarged view of FIG. 9G) that ranges from the tip of the boss portion B1 to the site corresponding to the portion positioned on the nearest fitting direction side in the engaging portion 53k of the hook portion 53f when the driven pulley 53 is assembled.

When the cylindrical portion 53c is molded by resin, it is necessary to use a mold for molding the inner circumferential portion of the cylindrical portion 53c and a mold for molding the hook portion 53f in combination. However, small resin burrs inevitably occur partially on the surface of the molded product at the corner portion where the molds are joined to each other. It is difficult to remove such burrs completely. Further, when the cylindrical portion 53c partially having such resin burrs on its inner circumference is fitted to the outer circumferential portion of the boss portion B1 and rotated, the partial resin burrs interfere with the surface of the outer circumferential portion of the boss portion B1 and the like in association with the rotation, and generally noises or vibrations occur.

However, in the present embodiment, as described above, at the outer circumferential portion on the tip side of the boss portion B1, the small diameter portion 53d whose outer diameter is set to be smaller by a prescribed amount is provided in the range Sd that ranges from the tip of the boss portion B1 to the site corresponding to the position positioned on the nearest fitting direction side in the engaging portion 53k of the hook portion 53f when the driven pulley 53 is assembled. By setting the outer diameter of the small diameter portion 53d appropriately in accordance with the height of the resin burrs occurred at the inner circumferential portion of the cylindrical portion 53c, even in a case where partial resin burrs are present on the inner circumference of the cylindrical portion 53, interference between the resin burrs and the surface of the outer circumferential portion of the boss portion B1 and the like can be surely prevented.

The foregoing description with reference to FIGS. 9D to 9G has been given as to the case where the driven pulley 53 is assembled to the boss portion B1. However, the foregoing description can be effectively applied to the case where, for example, the first gear set 71 and the second gear set 74 are respectively assembled to the boss portions B2 and B3. Further, without being limited to these cases, the foregoing description can be effectively applied to other various cases where, in rotatably assembling the rotary elements to the tip side of the hollow shafts, the rotary elements are rotatably assembled to the tip side of the hollow shafts without using any screw mechanism and while surely preventing the rotary elements from coming off.

On the front side of the unit base 60, an opening portion 62 which is square shaped in a front view is formed. To the opening portion 62, a flat-plate like positioning piece 81 is inserted and accommodated therein. The positioning piece 81 has its tip portion triangularly shaped in a planar view. The tip portion can engage with the slope face portions of the cam grooves 33a and 33b formed on the back side of the slide door 30. With the rear end of the positioning piece 81, one end of a spring 82 (e.g., a helical spring: see FIG. 9A) is engaged. By the elastic force of the spring 82, the positioning piece 81 is constantly biased forward (in the arrow $Y_F$ direction). The positioning piece 81 is retained in the opening portion 62 so as to be capable of advancing and receding, with its tip portion projecting by a prescribed amount in the normal state.

Above the unit base 60, a lever member 56 (a switching lever) is arranged. The lever member 56 is integrally structured to include a plate-like body portion 56b (a lever body), a first arm 56a, and a second arm 56c. On the bottom side of the lever body 56b, a pin-like rotary strut 56p is provided to downwardly project. The rotary strut 56p is rotatably supported as being inserted inside the hole 63 on the top side of the unit base 60.

Below the unit base 60, a lever member 57 (a switch lever) is arranged. The lever member 57 is integrally structured to include a body portion 57b (a lever body) having a cylindrical portion 57d, a first arm 57a, and a second arm 57c. The cylindrical portion 57d of the lever body 57b is fitted into a boss portion B5 that suspends from the unit base 60 and rotatably supported thereby. Near the boss portion B5, a hook portion 64 is provided, and the hook portion 64 prevents the lever body 57b from coming off downward.

With the switch lever 57, one end of a spring 83 (e.g., a helical spring: see FIG. 9C) is engaged. By the elastic force of this spring 83, the switch lever 57 is constantly biased in a prescribed rotation direction. The tip portion of the first arm portion 57a of the switch lever 57 engages with the upper groove 16a of the drive side portion 16 of the PMP retaining mechanism 10, and abuts on the depth wall of the groove 16a with a prescribed biasing force.

Further, the other end of the spring 83 (a helical spring: see FIG. 9C) is engaged with the tip (the bottom end) of the rotary strut 56p of the switching lever 56. With this structure, the switching lever 56 is provided with the effect of preventing coming off, and the rotation biasing force is applied thereto.

Here, with reference chiefly to FIG. 9H, a description will be given of the structure for providing the switching lever 56 with the effect of preventing coming off by the spring 83 and applying the rotation biasing force thereto. FIG. 9H is a view showing the bottom end portion of the rotary strut 56p of the switching lever 56 in an enlarged manner, in which (a) is a perspective view of the bottom end portion of the rotary strut, (b) is a bottom view showing an engaged state of the spring end with the bottom end portion of the rotary strut, and (c) is a side view showing an engaged state of the spring end with the bottom end portion of the rotary strut.

Into the hole 63 provided at the top of the unit base 60, the rotary strut 56p of the switching lever 56 is rotatably inserted. The switching lever 56 is preferably made of synthetic resin, and the rotary strut 56p is more preferably integrally molded with the switching lever 56. The rotary strut 56p is formed in a hollow cylindrical shape. At the bottom end thereof, an engaging portion 56e with which the other end of the spring 83 (the helical spring) is engaged is provided.

The engaging portion 56e is formed to be groove-like whose one direction (the opposite direction of the vertical wall 56h) being made open, with: a receiving face (a spring receiving face) 56f that is substantially perpendicular in the longitudinal direction of the rotary strut 56p; an engaging piece (a spring engaging piece) 56g that is arranged oppositely and substantially in parallel to the spring receiving face 56f at the end portion of the rotary strut 56p; and a vertical wall 56h that bridges between the spring engaging piece 56g and the spring receiving face 56f to couple them. It is to be noted that, the outer circumferential portion of the spring engaging piece 56g structures a part of the circle that is coaxial with a hollow portion 56t of the rotary strut 56p, and the diameter is set to be smaller than the inner diameter of the hollow portion 56t.

In assembling one end 83b of the spring (helical spring) 83 that can apply the rotation biasing force to the switching lever 56 into the bottom end portion of the rotary strut 56p of the switching lever 56, by causing the one end 83b of the spring 83 to engage with the groove-like engaging portion 56e from the direction opposing to the vertical wall 56h, the top and bottom of the one end 83b of the spring 83 are received by the spring receiving face 56f and the spring engaging piece 56g, and the side thereof is received by the vertical wall 56h.

In this manner, in the present embodiment, by causing the one end 83b of the spring 83 to engage with the engaging portion 56e, the action of the one end 83b of the spring 83 and the spring receiving face 56f surely prevents the rotary strut 56p from coming off downward (upward in FIG. 9B). Further, by the one end 83b of the spring 83, the rotation biasing force can be applied to the rotary strut 56p via the vertical wall 56. That is, with one spring 83, it becomes possible to apply the rotation biasing force to the switching lever 56 and the effect of preventing coming off can be provided thereto. Thus, simplification of structure and space saving can be realized.

Further, as described in the foregoing, the outer circumferential portion of the spring engaging piece 56g structures a part of the circle that is coaxial with the hollow portion 56t of the rotary strut 56p, and the diameter thereof is set to be smaller than the inner diameter of the hollow portion 56t. Accordingly, when the switching lever 56 is molded with resin, it is not necessary to apply a complicated structure such as a slide core to the mold used for molding the rotary strut 56p. That is, in providing the spring engaging piece 56g as the overhang portion to the end portion of the rotary strut 56p, the diameter of the spring engaging piece 56g is set such that it falls within the diameter range of the hollow portion 56t of the rotary strut 56p, the mold structure can be simplified.

When the PMP retaining mechanism 10 moves forward (in the arrow $Y_F$ direction in FIGS. 1A to 1C) and the tip portion of the first arm portion 57a of the switch lever 57 sits on and along the cam-shaped portion 16c formed at the relatively rear portion of the upper groove 16a, the switch lever 57 rotates in the counterclockwise direction (the CCW direction) in a planar view against the biasing force of the spring 83. Thus, the tip portion of the second arm portion 57c of the switch lever 57 abuts on the position detection switch 54s of the printed circuit board 54 to thereby turn the switch 54s ON. This ON signal is input to the circuit portion 54c of the printed circuit board 54 via the connector 54a. In this manner, the position detection switch 54s operates in association with the operation of the switch lever 57. Thus, the position detection switch 54s realizes detection that the PMP retaining mechanism 10 moves forward, i.e., particularly that it is at the draw out position.

Figure 10B:
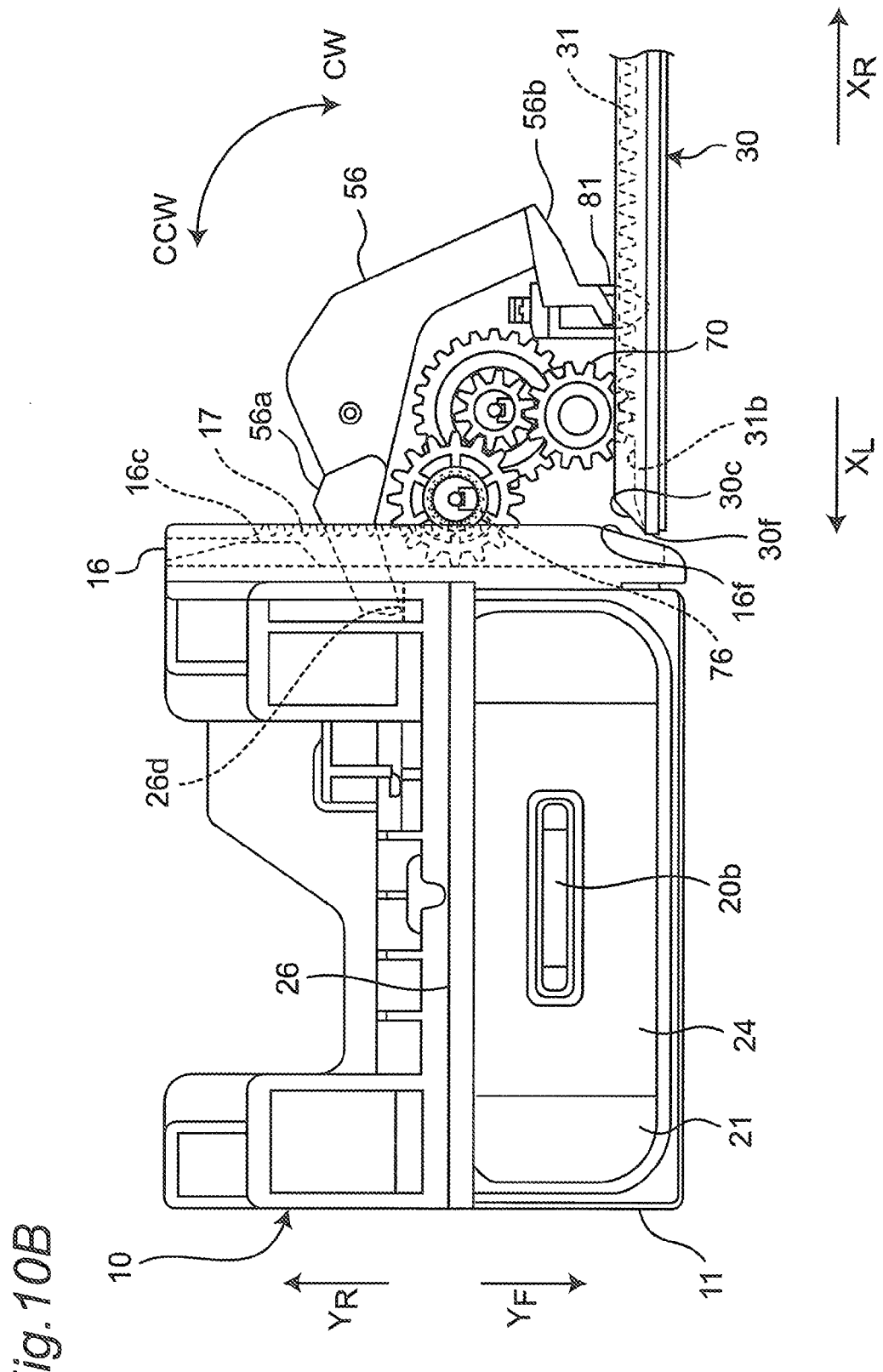
FIG. 10B is a plan view showing the positional relationship and the moving operation among the PMP retaining mechanism, the driver unit, and the slide door, in an initial state where the front side of the PMP retaining mechanism is open and the PMP retaining mechanism advances.
Figure 10D:
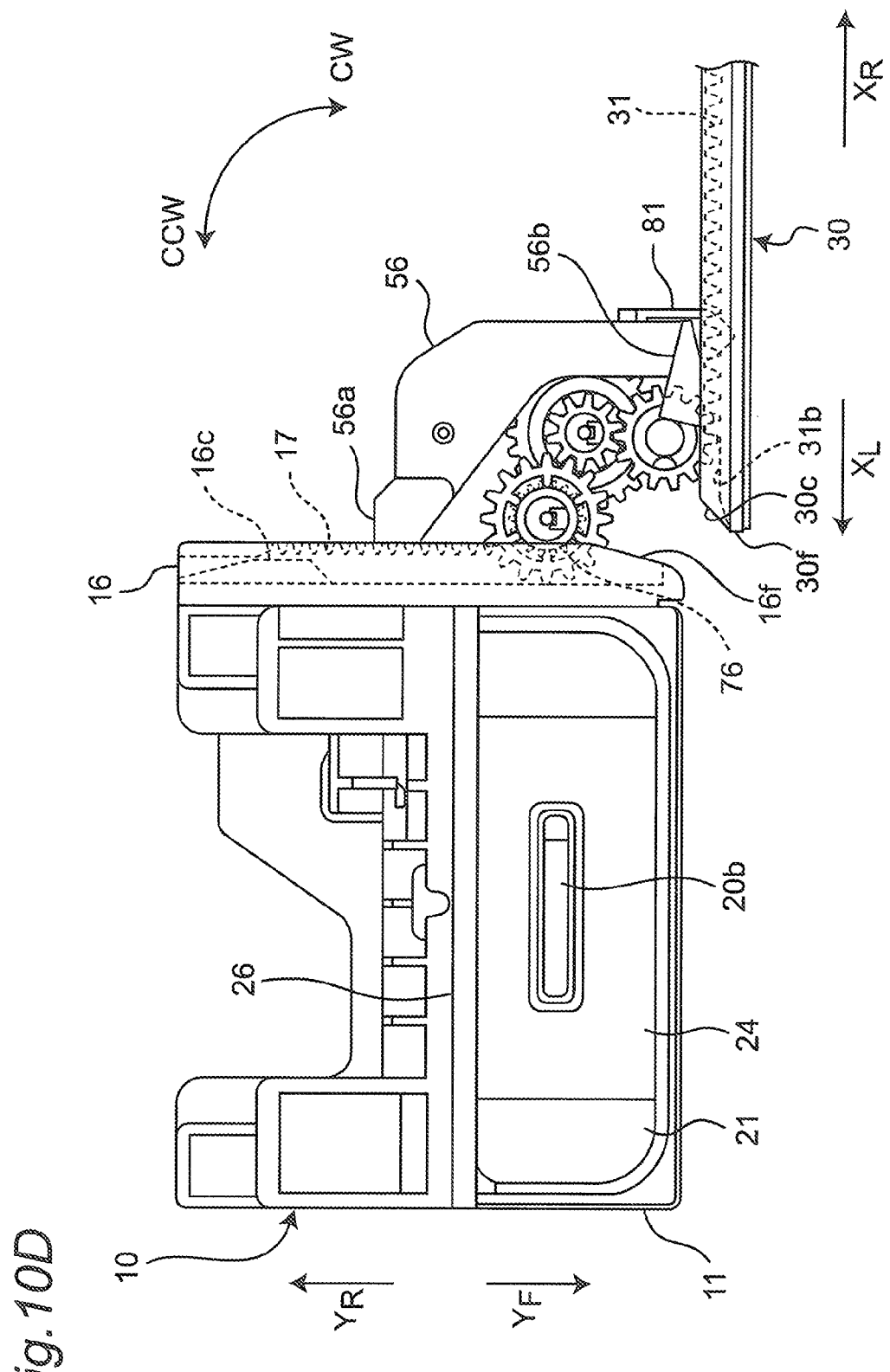
FIG. 10D is a plan view showing the positional relationship and the moving operation among the PMP retaining mechanism, the driver unit, and the slide door, in a state where the PMP retaining mechanism recedes and before its front side is closed by the slide door.

Next, with reference chiefly to FIGS. 10A to 10D, a description will be given of the front and rear direction operation of the PMP retaining mechanism 10. FIGS. 10A to 10D are each a plan view schematically showing the positional relationship and the moving operation of the PMP retaining mechanism 10, the driver unit 50, and the slide door 30. FIG. 10A shows the state where the front side of the PMP retaining mechanism 10 is closed by the slide door 30. FIG. 10B shows the initial state where the front side of the PMP retaining mechanism 10 is opened and the PMP retaining mechanism 10 advances. FIG. 10C shows the state where the PMP retaining mechanism 10 has advanced to arrive at the draw out position. FIG. 10D shows the state where the PMP retaining mechanism 10 recedes and before the front side thereof is closed by the slide door 30.

As shown in FIG. 10A, in a state where the front side of the PMP retaining mechanism 10 is closed by the slide door 30, when the first driving gear 70 rotates in the counterclockwise direction (the CCW direction), the first driving gear 70 meshes with the driving rack gear 31 of the slide door 30 via the idle rack gear 42, to press the positioning piece 81 rearward (the arrow $Y_R$ direction) along the slope face of the cam groove 33a of the slide door 30 against the biasing force of the spring 82. This causes the slide door 30 to move to the right side (in the arrow $X_R$ direction). When the slide door 30 further continuously moves in the right direction, the abutting face 32c (see FIGS. 4A and 4D) near the left end of the slide door 30 abuts on the tip portion of the second arm 56c of the switching lever 56. This causes the switching lever to rotate in the counterclockwise direction (the CCW direction).

When the first driving gear 70 is further rotated, the slide door 30 moves to the right side (in the arrow $X_R$ direction) until the first driving gear 70 passes over the terminal teeth of the driving rack gear 31 of the slide door 30 to correspond to the left end notch 31b, and the first driving gear 70 and the driving rack gear 31 become out of mesh.

Here, the tip portion of the first arm portion 56a of the switching lever 56 presses the prescribed portion 26d on the back side of the back supporter 26 of the PMP retaining mechanism 10 frontward (in the arrow $Y_F$ direction). Thus, the PMP retaining mechanism 10 is pushed forward, and as shown in FIG. 10B, the side rack gear 17 of the drive side portion 16 of the PMP retaining mechanism 10 meshes with the second driving gear 76.

When the electric motor 51 is further continuously rotated, since the second driving gear 76 meshes with the side rack gear 17, the drive side portion 16 (hence, the whole PMP retaining mechanism 10) is pushed forward, and brought to the advanced position.

At this time, the tip portion of the first arm 57a of the switch lever 57 abuts on the front slope face of the cam-shaped portion 16c of the upper groove 16a of the drive side portion 16 of the PMP retaining mechanism 10 and sits thereon. This causes the switch lever 57 to rotate in the counterclockwise direction (the CCW direction). In accordance therewith, the second arm portion 17c actuates the position detection-purpose switch 54s attached to the printed circuit board 54, to thereby stop the rotation of the electric motor 51 and secure the advanced position of the PMP retaining mechanism 10.

Further, it is structured such that, at this time, a slope face portion 16f provided on the front side of the drive side portion 16 causes a left end face 30f of the slide door 30 to further move to the right side (in the arrow $X_R$ direction) along the slope, the left end face 30f being out of mesh with the first driving gear 70 and in the stopped state, and whereby the gears more surely become out of mesh.

FIG. 10C shows the advance complete state (the draw out state) of the PMP retaining mechanism 10. It is structured such that, in this state, even if the slide door 30 is intentionally pushed to the left side (in the arrow $X_L$ direction), the left end face 30f of the slide door 30 abuts on and stopped by the outer side face of the drive side portion 16, and whereby a gap between the first driving gear 70 and the terminal teeth of the driving rack gear 31 of the slide door 30 is secured, and gears will not mesh with each other.

In the state where the PMP retaining mechanism 10 is at the advance complete position (the draw out position), the electric motor 51 is reversely rotated, to rotate the second driving gear 76 in the clockwise direction (the CW direction), the side rack gear 17 moves rearward (in the arrow $Y_R$ direction), and hence the PMP retaining mechanism 10 recedes. In accordance with the receding operation of the PMP retaining mechanism 10, the prescribed portion 26d on the back side of the back supporter 26 abuts on the tip portion of the first arm 56a of the switching lever 56, and rotates the switching lever 56 in the clockwise direction (the CW direction).

Thus, the tip portion of the second arm 56c of the switching lever 56 presses the abutting face 32c of the slide door 30 to the left side (in the arrow $X_L$ direction), and as shown in FIG. 10D, the first driving gear 70 and the driving rack gear 31 of the slide door 30 mesh with each other. When the electric motor 51 is further continuously rotated to cause the first driving gear 70 to rotate in the clockwise direction (the CW direction), the slide door 30 further moves to the left side (in the arrow $X_L$ direction).

After the first driving gear 70 and the driving rack gear 31 of the slide door 30 mesh with each other, the second driving gear 76 still continues to rotate. However, as the PMP retaining mechanism 10 recedes, the second driving gear 76 and the side rack gear 17 of the PMP retaining mechanism 10 become out of mesh.

It is structured such that, in this state, as the tip portion of the first arm portion 57a of the switch lever 57 having been sitting on the cam-shaped portion 16c of the upper groove 16a of the drive side portion 16 of the PMP retaining mechanism 10 abuts on the front slope face of the cam-shaped portion 16c. Further, the drive side portion 16 (hence, the whole PMP retaining mechanism 10) is pushed and moves rearward (in the arrow $Y_R$ direction) by the biasing force of the spring 83 acting on the switch lever 57.

It is structured such that, further continuous rotation of the electric motor 51 causes the slide door 30 to further move to the left side (in the arrow $X_L$ direction); and that the slope face 30c provided on the left end face side of the back side of the slide door 30 causes the right end front face of the PMP retaining mechanism 10 which is out of mesh with the second driving gear 76 and stopped to further move rearward (in the arrow $Y_R$ direction) along the slope, such that the gears become out of mesh more surely. Further continuous rotation of the electric motor 51 brings the slide door 30 to the position where the front side of the PMP retaining mechanism 10 at the recede position is closed (see FIG. 10A).

As has been described in the foregoing, according to the present embodiment, in connection with the music reproduction apparatus 1 capable of addressing reproduction of two types of external audio sources, i.e., the CD 5 and the PMP 6, the PMP retaining mechanism 10 that is at the accommodation position on the deeper side of the slide door 30 in the state being covered by the slide door 30 can be automatically moved between the accommodation position and the draw out position in accordance with the opening-closing state of the slide door 30, without the necessity for the user to perform troublesome manual operation. Thus, the operability of the apparatus 1 can be improved. Further, interference between the slide door 30 and the PMP retaining mechanism 10 can be surely prevented when the slide door 30 is operated to open and close.

In particular, in the present embodiment, provision of the switching lever 56 that selectively and substantially continuously switches and transmits the drive force from the single electric motor 51 as a drive source between the power transmission path for moving the slide door 30 and the power transmission path for moving the PMP retaining mechanism 10 allows the slide door 30 and the PMP retaining mechanism 10 to move with the single drive source (the electric motor 51) without any trouble, even in the case where the moving direction of the slide door 30 and the moving direction of the PMP retaining mechanism 10 are substantially perpendicular to each other.

With the music reproduction apparatus 1 according to the present embodiment, as can be clearly seen from FIGS. 1A to 1C, the front panel 3 is substantially vertically supported. Accordingly, the CD reproduction unit U1 that performs music reproduction using the compact disc (CD) 5 as an external audio source is used as a so-called upright type disc apparatus.

Generally, with such an upright type disc apparatus (CD reproduction unit) U1, when attaching or removing the disc 5 to or from the turn table 8 that rotatably supports the disc (CD) 5, the user must perform the attaching or removing work carefully so as not to drop the CD 5 often using both the hands. This requires the user to perform troublesome work.

The turn table 8 normally clamps a central hole 5h of the disc 5 by three nails that are called the "nail clamps" and that are provided at a central boss portion 8b of the turn table 8, to thereby surely transmit the rotary force of the motor 7 to the disc 5. Accordingly, when the disc 5 is to be attached to the turn table 8, the following work becomes necessary: centering the central hole 5h of the disc 5 relative to the central boss portion 8b of the turn table 8 and fitting the disc 5 thereto; and pressing the disc 5 to apply force of pressing the clamp nails. Since this work must be performed in the substantially perpendicular direction, it has never been an easy work for the user.

Therefore, in the present embodiment, in connection with the upright type disc apparatus U1, workability of attaching or removing the disc 5 to or from the turn table 8 can be enhanced. In the following, with reference to FIGS. 11A to 11D, a description will be given of the structure for improving attachment performance of the disc 5.

Figure 11A:
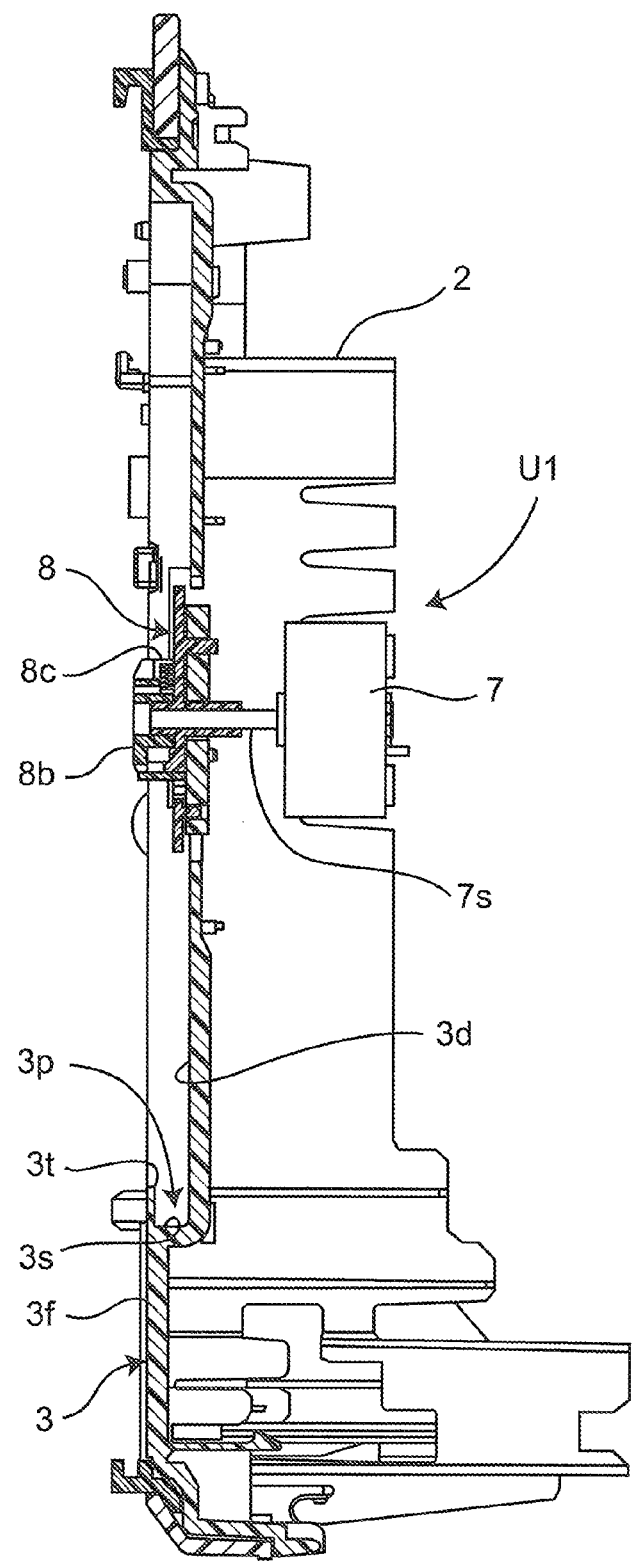
FIG. 11A is a schematic cross-sectional view of a CD reproduction unit taken along a line L11-L11 in FIG. 2.
Figure 11B:
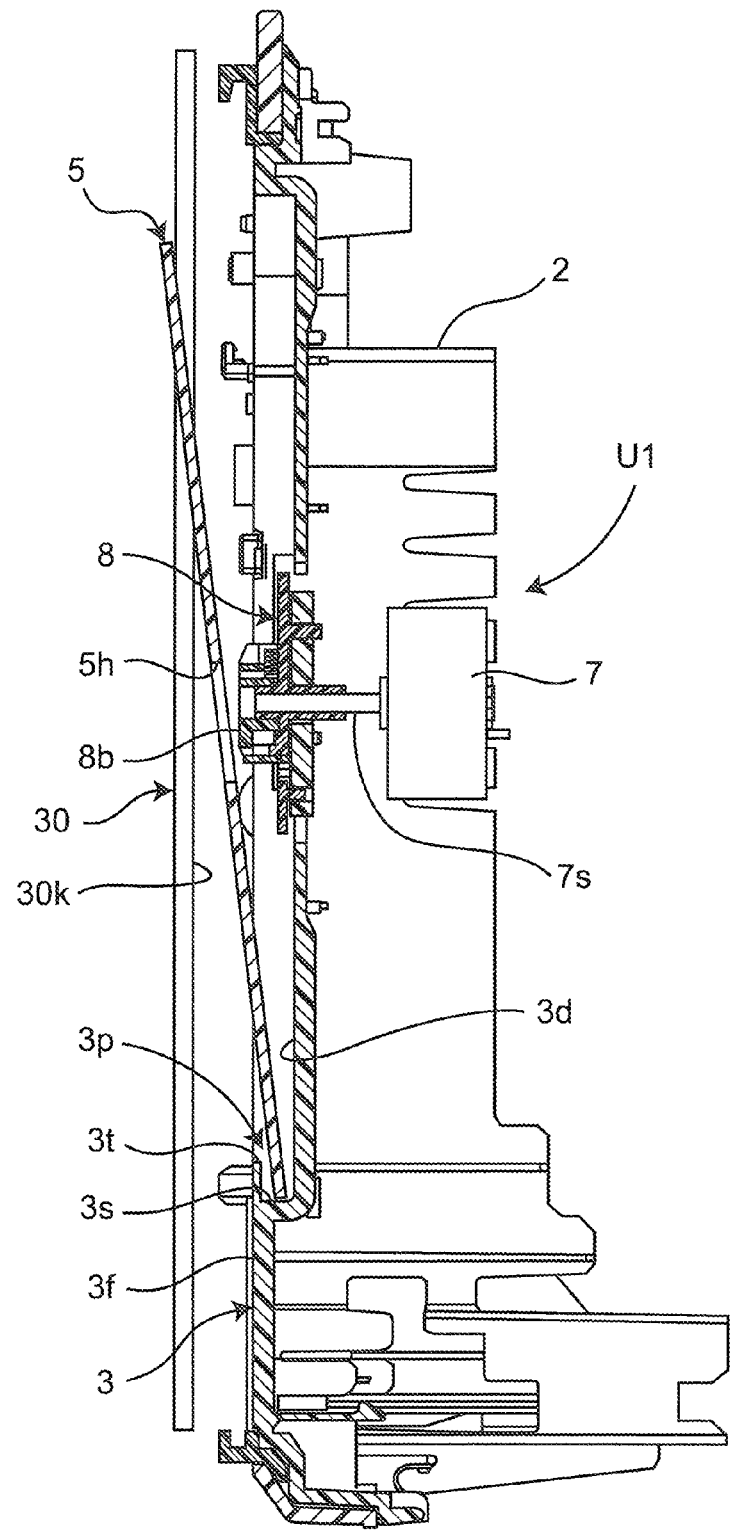
FIG. 11B is a cross-sectional view similar to FIG. 11A, showing a state during attachment of a disc.
Figure 11C:
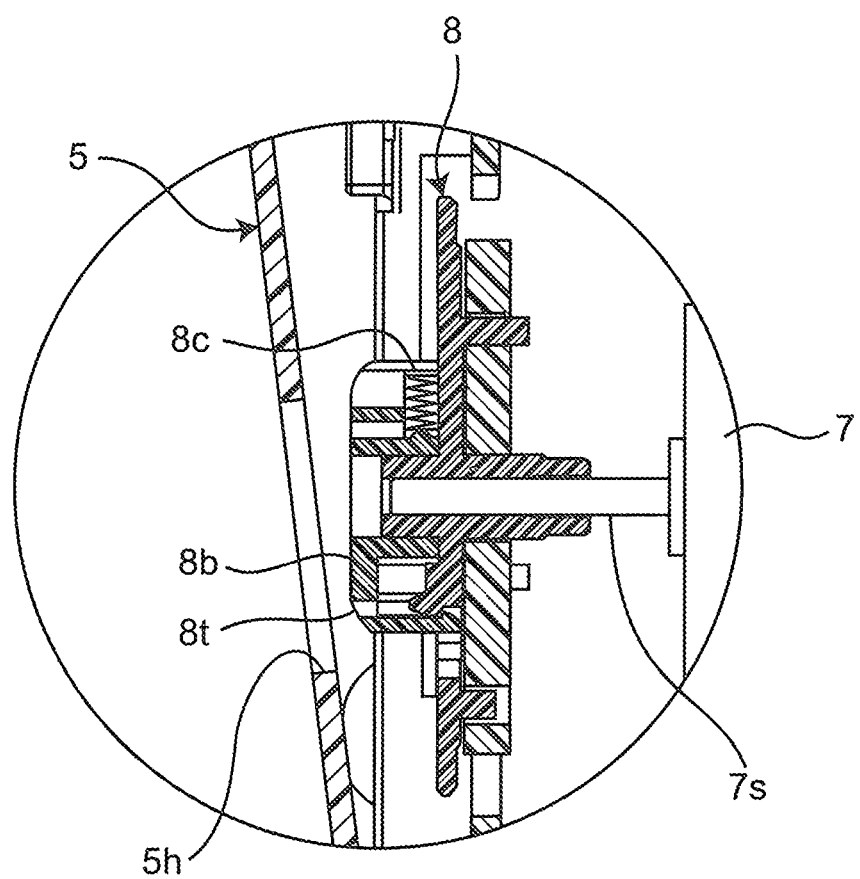
FIG. 11C is an enlarged cross-sectional view showing the chief portion of FIG. 11B.

FIG. 11A is a schematic cross-sectional view of the disc apparatus (CD reproduction unit) U1 taken along a line L11-L11 in FIG. 2. Further, FIG. 11B is a cross-sectional view which is similar to FIG. 11A, showing the state during attachment of the disc. Still further, FIG. 11C is a chief portion enlarged cross-sectional view showing the chief part of FIG.

Figure 11D:
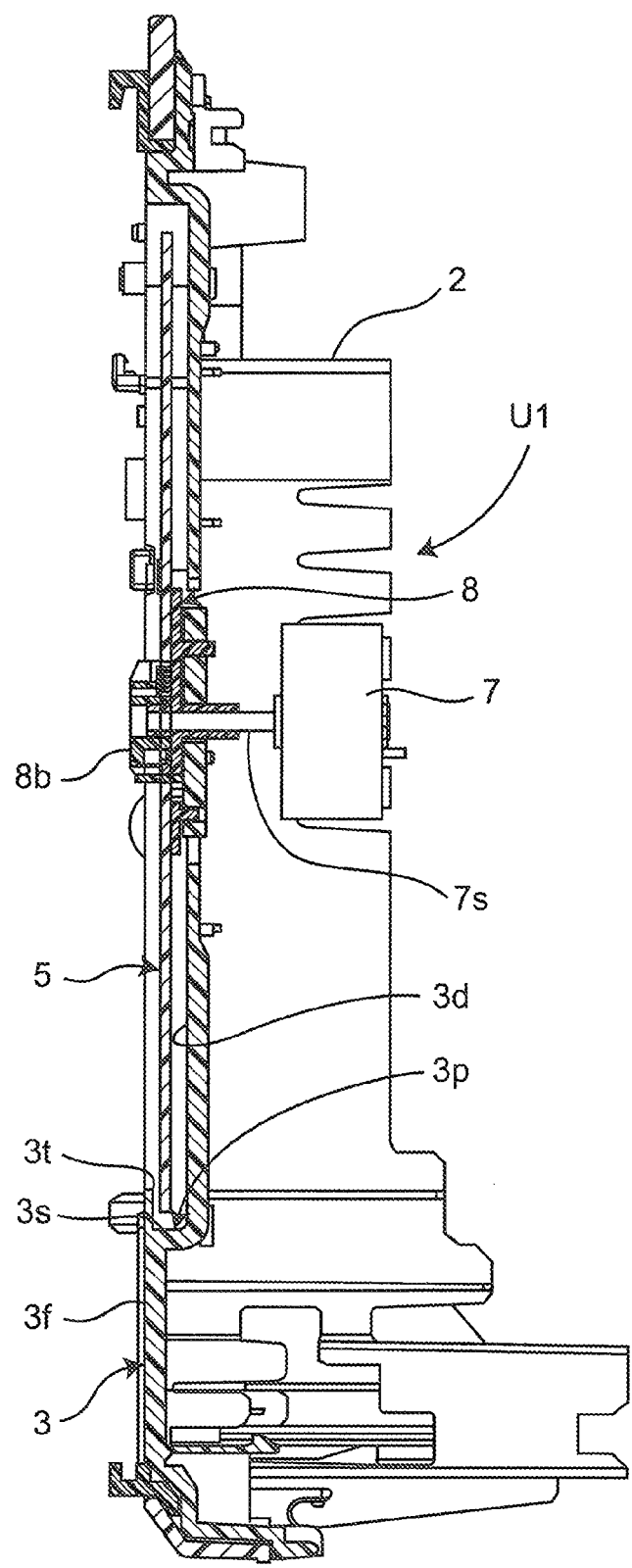
FIG. 11D is a cross-sectional view similar to FIG. 11A, showing a disc attachment complete state.

11B in an enlarged manner. Still further, FIG. 11D is a cross-sectional view which is similar to FIG. 11A, showing the disc attachment complete state.

In connection with the upright type disc apparatus (CD reproduction unit) U1 according to the present embodiment, in the front panel 3 at the region corresponding to the disc apparatus U1, a step-down face 3d for accommodating the disc (CD) 5 is formed as being stepped down by a prescribed amount (a slight amount) from the surface 3f. The turn table 8 is attached using this step-down face 3d as the base face. The turntable 8 is fixed to an output shaft 7s of the motor 7 arranged in the outer case 2 on the back side of the front panel 3. The turn table 8 is provided with the boss portion 8b at its center for fitting the central hole 5h of the disc 5 thereinto. To this central boss portion 8b, three well-known nail clamps 8c are mounted.

In the present embodiment, in the region corresponding to the bottom end portion of the step-down face 3d, a pocket portion 3p that can accommodate the bottom end portion of the disc 5 is formed. The pocket portion 3p is formed with the step-down face 3d in the region corresponding to the bottom end portion, a stepped wall 3s that bridges and couples the surface 3f of the front panel 3 and the step-down face 3d at the bottom end portion, and a vertical wall 3t that is formed to rise from the front edge of the stepped wall 3s by a prescribed height.

The pocket portion 3p is set such that, in the state where the bottom end portion of the disc 5 is accommodated, at least a part of the tip portion of the central boss portion 8b of the turn table 8 is in the inner circumferential range of the central hole 5h of the disc 5.

With this structure, in the upright type disc apparatus U1, provision of the pocket portion 3p that can accommodate the bottom end portion of the disc 5 at the bottom end portion of the step-down face 3d where the turn table 8 is arranged allows the user to tentatively place the disc 5 in the state where the bottom end portion of the disc 5 is accommodated in the pocket portion 3p when the disc 5 is to be attached or removed to or from the turn table 8. This largely improves convenience and workability. Further, since the pocket portion 3p is set such that at least a part of the tip portion of the central boss portion 8b of the turn table 8 is in the inner circumferential range of the central hole 5h of the disc 5 in the state where the bottom end portion of the disc 5 is accommodated, the work of centering the central hole 5h of the disc 5 to the central boss portion 8b of the turn table 8 can be made more easier when the disc 5 is to be attached to the turn table 8.

That is, in the present embodiment, the work to be done is divided into: the tentative-placement work of accommodating the bottom end portion of the disc 5 in the pocket portion 3p; and the work of pressing the disc 5 against the turn table 8 to press in the clamp nails 8c. In the aforementioned tentative-placement state, when the user again presses the disc 5 toward the turn table 8 side, a taper face 8t provided at the circumference of the tip of the central boss portion 8b of the turn table 8 guides and centers the central hole 5h of the disc 5. Thus, as shown in FIG. 11D, in the state where an appropriate gap is secured around the disc 5, the disc 5 can be rotated and attachment of the disc 5 is easily realized without the risk of dropping the disc or the like.

Further, more preferably in this case, it is set such that, as to the case where the slide door 30 opens the front side of the turn table 8, in the state where the bottom end portion of the disc 5 is accommodated in the pocket portion 3p and a part of the inner wall 30k of the slide door 30 supports the side of the corresponding portion of the disc 5, at least a part of the tip portion of the central boss portion 8b of the turn table 8 is in the inner circumferential range of the central hole 5h of the disc 5.

With this structure, when the disc 5 is to be attached or removed to or from the turn table 8, in the state where the disc 5 is supported at its bottom end portion by the pocket portion 3p and a part of the side face of the disc 5 is supported by a part of the inner wall 30k of the slide door 30, the disc 5 can be more surely tentatively placed.

It goes without saying that the present invention is not limited to the embodiment described above, and various improvements or changes in terms of design can be made without departing from the scope of the invention.

INDUSTRIAL APPLICABILITY

The present invention can be effectively used as a music reproduction apparatus that can address reproduction of two different types of external audio sources such as a CD and a PMP.

EXPLANATION OF REFERENCE SYMBOLS

1 MUSIC REPRODUCTION APPARATUS
5 COMPACT DISC (CD)
6 PORTABLE MEDIA PLAYER (PMP)
8 TURN TABLE
9 OPTICAL PICKUP
10 PMP RETAINING MECHANISM
11 BASE PEDESTAL
16 DRIVE SIDE PORTION
17 SIDE RACK GEAR
21 TERMINAL BLOCK
24 REFLECTING MIRROR
26 BACK SUPPORTER
29 SPRING
30 SLIDE DOOR
31 DRIVING RACK GEAR
41 IDLE RACK
50 DRIVER UNIT
51 ELECTRIC MOTOR
56 SWITCHING LEVER
56a FIRST ARM OF SWITCHING LEVER
56c SECOND ARM OF SWITCHING LEVER
57 SWITCH LEVER
70 FIRST DRIVING GEAR
76 SECOND DRIVING GEAR
81 POSITIONING PIECE
82, 83 SPRING
Pt1, Pt2, Pt3 PROTRUSION (ON BACK SIDE OF SLIDE DOOR)
Sw1, Sw2, Sw3 POSITION DETECTION-PURPOSE SWITCH
U1 CD REPRODUCTION UNIT
U2 PMP REPRODUCTION UNIT

The invention claimed is:

1. A music reproduction apparatus, comprising:
a first external audio source-use first reproduction unit that has a first retainer capable of retaining a first external audio source;
a second external audio source-use second reproduction unit that has a second retainer capable of retaining a second external audio source, the first reproduction unit and the second reproduction unit being arranged next to each other;
an opening-closing door that covers at least one of the first reproduction unit and the second reproduction unit in an openable and closable manner, the opening-closing door being composed of a slide door, the at least one of the retainers that is covered by the opening-closing door in an openable and closable manner being positioned at an accommodation position on a deeper side than the opening-closing door in a state where the at least one of the retainers is covered by the opening-closing door, the at least one of the retainers being drawn out from the accommodation position in a direction perpendicular to a moving direction of the opening-closing door and moving to a draw out position when the opening-closing door is moved to uncover the retainer, and the draw out position being a position where at least a part of the retainer exists at a front side relative to the opening-closing door;

a switching means for selectively and substantially continuously switching and transmitting a drive force from a single drive source between a first power transmission path that moves the opening-closing door and a second power transmission path that moves the retainer; and a first and a second driving gears that are each constantly rotated via a prescribed deceleration mechanism by a rotary drive force from the single drive source, wherein the opening-closing door includes an opening-closing door rack gear that extends in the moving direction of the opening-closing door and that is capable of meshing with the first driving gear, and an opening-closing door engaging portion that is capable of engaging with one end side of a switching lever of the switching means, the opening-closing door being capable of moving among a fully closed position where the reproduction units are entirely covered, a first open position where the second retainer solely is covered while the first retainer being uncovered, and a second open position where the first retainer solely is covered while the second retainer being uncovered, the second retainer includes a retainer rack gear that extends in the moving direction of the second retainer and that is capable of meshing with the second driving gear, and a retainer engaging portion that is capable of engaging with an other end side of the switching lever of the switching means, the second retainer being capable of moving between the accommodation position and the draw out position, when the opening-closing door moves from the fully closed position to the second open position, the opening-closing door engaging portion pushes the one end side of the switching lever, to cause the other end side of the switching lever to push the retainer engaging portion to move the second retainer from the accommodation position toward the draw out position, such that the second driving gear meshes with the retainer rack gear to bring the second retainer to the draw out position, and when the second retainer moves from the draw out position to the accommodation position, the retainer engaging portion pushes the other end side of the switching lever, to cause the one end side of the switching lever to push the opening-closing door engaging portion to move the opening-closing door from the second open position toward the fully closed position, such that the first driving gear meshes with the opening-closing door rack gear to bring the opening-closing door to the fully closed position.

2. The music reproduction apparatus according to claim 1, further comprising:

a positioning member that positions the opening-closing door at one of the fully closed position and the second open position, wherein the opening-closing door is provided, on a back side thereof, with cam grooves each having a slope face portion capable of engaging with the positioning member when the opening-closing door is at the fully closed position or at the second open position, respectively, the opening-closing door rack gear is provided with notches so that the opening-closing door rack gear and the first driving gear become out of mesh in a state where the opening-closing door is at the fully closed position and at the second open position, respectively, and when the opening-closing door moves to one of the fully closed position and the second open position to cause the opening-closing door rack gear and the first driving gear to become out of mesh, the positioning member engages with the corresponding one of the cam grooves while pushing the slope face portion of the corresponding cam groove in a direction in which a terminal teeth near corresponding one of the notches of the opening-closing door rack gear and the first driving gear become away from each other.

3. The music reproduction apparatus according to claim 2, further comprising:

a second positioning member that positions the second retainer at one of the accommodation position and the draw out position, wherein the second retainer is provided, at a side portion thereof, with a cam-shaped portion having a slope face portion being capable of engaging with the second positioning member, the retainer rack gear is provided with a notch so that the retainer rack gear and the second driving gear become out of mesh in a state where the second retainer is at the accommodation position, and when the second retainer moves to the accommodation position to cause the retainer rack gear and the second driving gear to become out of mesh, the second positioning member engages with the cam-shaped portion while pushing the slope face portion of the cam-shaped portion in a direction in which a terminal teeth near the notch of the retainer rack gear and the second driving gear become away from each other.

4. The music reproduction apparatus according to claim 1, wherein the opening-closing door rack gear is provided with a notch so that the openingclosing door rack gear and the first driving gear become out of mesh in a state where the opening-closing door is at the second open position, the second retainer is provided, at its side end portion on a side of drawing out and near to the opening-closing door, with a slope face portion that tilts by a prescribed angle, when the second retainer moves from the accommodation position to the draw out position in a state where the opening-closing door has moved to the second open position to cause the opening-closing door rack gear and the first driving gear to become out of mesh, the slope face portion of the second retainer pushes a side end portion of the opening-closing door on a side near to the second retainer, to move the opening-closing door in a direction in which the opening-closing door rack gear and the first driving gear become out of mesh, and when the second retainer is at the draw out position, even when the opening-closing door is pushed toward the second retainer, the side end portion of the opening-closing door and the side end portion of the second retainer abut on each other, to prevent the opening-closing door from moving toward the second retainer side.

5. The music reproduction apparatus according to claim 1, wherein
the retainer rack gear is provided with a notch so that the retainer rack gear and the second driving gear become out of mesh in the state where the second retainer is at the accommodation position, and
the opening-closing door is provided, at its side end portion on a side back thereof and near to the second retainer, with a slope face portion that tilts by a prescribed angle,
when the opening-closing door moves from the second open position to the fully closed position in a state where the second retainer has moved to the accommodation position to cause the retainer rack gear and the second driving gear to become out of mesh, the slope face portion on the back side of the opening-closing door pushes an end portion of the second retainer on a draw out side, to move in a direction in which the retainer rack gear and the second driving gear become out of mesh, and
when the opening-closing door is at the fully closed position, even when the second retainer is pushed toward the draw out side, the end portion of the second retainer on the draw out side abuts on the back side of the opening-closing door, to prevent the second retainer from moving toward the draw out side.

6. The music reproduction apparatus according to claim 1, further comprising:
a position detection switch that detects the second retainer at the draw out position, and
a positioning member that positions the second retainer at one of the accommodation position and the draw out position, wherein
the position detection switch actuates in association with an operation of the positioning member.

7. The music reproduction apparatus according to claim 1, wherein
the second retainer includes a base pedestal that is movably arranged between the accommodation position and the draw out position, a back supporter that is fixed to the base pedestal to support a back face of the second external audio source, a terminal block that is supported by the base pedestal so as to be capable of swinging in front and rear directions, and a connector terminal for connecting the second external audio source, the connector terminal being attached to the terminal block, and
between at least one of the base pedestal and the back supporter and the terminal block, a biasing means for exerting a biasing force that presses the second external audio source connected to the connector terminal against the back supporter is provided.

8. The music reproduction apparatus according to claim 1, which is capable of using a portable media player as a removable external audio source, the music reproduction apparatus further comprising:
a terminal block that has an attaching face portion that receives the portable media player being attached from a prescribed direction;
a connector terminal mounted at the attaching face portion of the terminal block where a terminal socket portion of the portable media player being connected; and
a mirror surface member arranged at the attaching face portion of the terminal block, the mirror surface member reflecting at least the terminal socket portion of the portable media player when the terminal socket portion is to be connected to the connector terminal.

9. The music reproduction apparatus according to claim 1, further comprising:
a positioning member that positions the second retainer at one of the accommodation position and the draw out position, wherein
the second retainer is provided, at a side portion thereof, with a cam-shaped portion having a slope face portion being capable of engaging with the positioning member,
the retainer rack gear is provided with a notch so that the retainer rack gear and the second driving gear become out of mesh in a state where the second retainer is at the accommodation position, and
when the second retainer moves to the accommodation position to cause the retainer rack gear and the second driving gear to become out of mesh, the positioning member engages with the cam-shaped portion while pushing the slope face portion of the cam-shaped portion in a direction in which a terminal teeth near the notch of the retainer rack gear and the second driving gear become away from each other.

10. The music reproduction apparatus according to claim 2, wherein
the second retainer includes a base pedestal that is movably arranged between the accommodation position and the draw out position, a back supporter that is fixed to the base pedestal to support a back face of the second external audio source, a terminal block that is supported by the base pedestal so as to be capable of swinging in front and rear directions, and a connector terminal for connecting the second external audio source, the connector terminal being attached to the terminal block, and
between at least one of the base pedestal and the back supporter and the terminal block, a biasing means for exerting a biasing force that presses the second external audio source connected to the connector terminal against the back supporter is provided.

11. The music reproduction apparatus according to claim 9, wherein
the second retainer includes a base pedestal that is movably arranged between the accommodation position and the draw out position, a back supporter that is fixed to the base pedestal to support a back face of the second external audio source, a terminal block that is supported by the base pedestal so as to be capable of swinging in front and rear directions, and a connector terminal for connecting the second external audio source, the connector terminal being attached to the terminal block, and
between at least one of the base pedestal and the back supporter and the terminal block, a biasing means for exerting a biasing force that presses the second external audio source connected to the connector terminal against the back supporter is provided.

12. The music reproduction apparatus according to claim 4, wherein
the second retainer includes a base pedestal that is movably arranged between the accommodation position and the draw out position, a back supporter that is fixed to the base pedestal to support a back face of the second external audio source, a terminal block that is supported by the base pedestal so as to be capable of swinging in front and rear directions, and a connector terminal for connecting the second external audio source, the connector terminal being attached to the terminal block, and
between at least one of the base pedestal and the back supporter and the terminal block, a biasing means for exerting a biasing force that presses the second external audio source connected to the connector terminal against the back supporter is provided.

13. The music reproduction apparatus according to claim 5, wherein the second retainer includes a base pedestal that is movably arranged between the accommodation position and the draw out position, a back supporter that is fixed to the base pedestal to support a back face of the second external audio source, a terminal block that is supported by the base pedestal so as to be capable of swinging in front and rear directions, and a connector terminal for connecting the second external audio source, the connector terminal being attached to the terminal block, and between at least one of the base pedestal and the back supporter and the terminal block, a biasing means for exerting a biasing force that presses the second external audio source connected to the connector terminal against the back supporter is provided.

14. The music reproduction apparatus according to claim 6, wherein
the second retainer includes a base pedestal that is movably arranged between the accommodation position and the draw out position, a back supporter that is fixed to the base pedestal to support a back face of the second external audio source, a terminal block that is supported by the base pedestal so as to be capable of swinging in front and rear directions, and a connector terminal for connecting the second external audio source, the connector terminal being attached to the terminal block, and between at least one of the base pedestal and the back supporter and the terminal block, a biasing means for exerting a biasing force that presses the second external audio source connected to the connector terminal against the back supporter is provided.

* * * * *